(12) United States Patent
Sawal et al.

(10) Patent No.: US 11,736,570 B2
(45) Date of Patent: Aug. 22, 2023

(54) SYSTEM AND METHOD FOR OCCUPANCY BASED MANAGEMENT OF DISTRIBUTED SYSTEMS

(71) Applicant: Dell Products L.P., Round Rock, TX (US)

(72) Inventors: Vinay Sawal, Fremont, CA (US); Sithiqu Shahul Hameed, Chennai (IN); Udhaya Chandran Shanmugam, Santa Clara, CA (US)

(73) Assignee: Dell Products L.P., Round Rock, TX (US)

( * ) Notice: Subject to any disclaimer, the term of this patent is extended or adjusted under 35 U.S.C. 154(b) by 89 days.

(21) Appl. No.: 17/579,305

(22) Filed: Jan. 19, 2022

(65) Prior Publication Data

US 2023/0231917 A1    Jul. 20, 2023

(51) Int. Cl.
*H04L 67/12* (2022.01)
*H05K 5/00* (2006.01)
*H04L 41/5019* (2022.01)

(52) U.S. Cl.
CPC .......... *H04L 67/12* (2013.01); *H04L 41/5019* (2013.01); *H05K 5/006* (2013.01); *H05K 5/0073* (2013.01)

(58) Field of Classification Search
CPC ..... H04L 67/12; H04L 41/5019; H05K 5/006; H05K 5/0073
See application file for complete search history.

(56) References Cited

U.S. PATENT DOCUMENTS

| | | | |
|---|---|---|---|
| 9,864,417 B2 * | 1/2018 | Bermudez Rodriguez | G06F 1/3206 |
| 2011/0241833 A1 * | 10/2011 | Martin | G08C 21/00 707/705 |
| 2022/0407455 A1 * | 12/2022 | Conti | H02S 50/00 |

OTHER PUBLICATIONS

Austin House "InfraSolution" Catalog, published by Austin Hughes Electronics Ltd. on Nov. 29, 2020; available online at http://web.archive.org/web/20200810192944/https://www.austin-hughes.com/resource_cat/product-resources/rack-access-resources/.
Wikipedia "Path MTU Discovery" Article, published by Wikipedia on Nov. 19, 2021;available Online at http://web.archive.org/web/20211119214201/https://en.wikipedia.org/wiki/Path_MTU_Discovery.
Tripplite "Rack Basics: Everything You Need to Know Before You Equip Your Data Center" Article, published on May 15, 2021; available online at http://web.archive.org/web/20210515085036/https://www.tripplite.com/support/rack-cabinet-basics-selection-installation-cooling.

* cited by examiner

*Primary Examiner* — Normin Abedin
(74) *Attorney, Agent, or Firm* — Womble Bond Dickinson (US) LLP

(57) ABSTRACT

Methods, systems, and devices for providing computer implemented services using managed systems are disclosed. To provide the computer implemented services, the managed systems may be deployed to a location and operate in a predetermined manner conducive to, for example, execution of applications that provide the computer implemented services. When deployed to a location, the managed systems may be housed in a managed system frame. The managed (Continued)

system frames may include systems to guide placement of managed system in preferred frame units, remotely identify occupancy of the frame units, and/or the frame units against unexpected removals of or insertion of devices in the frame units.

20 Claims, 21 Drawing Sheets

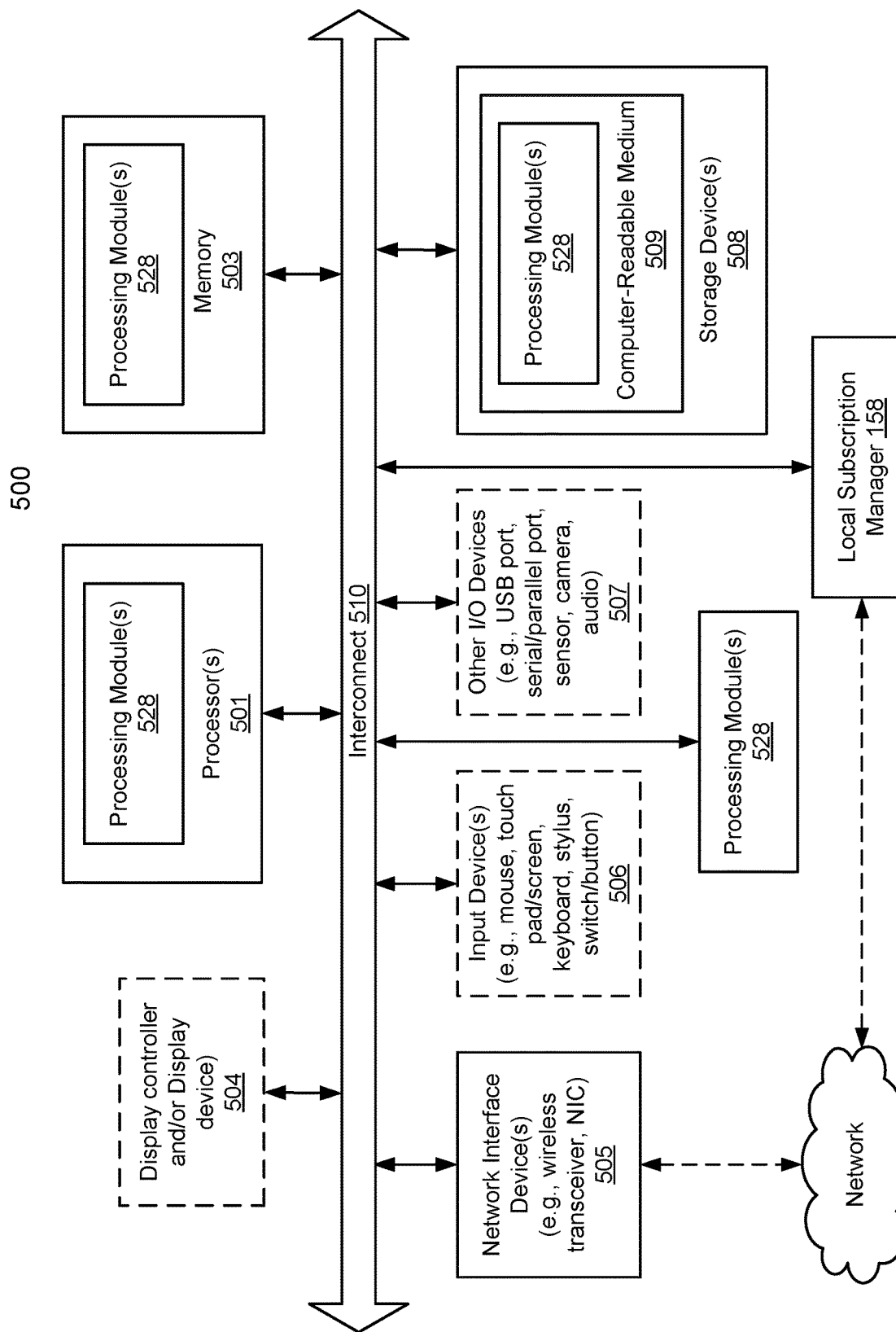

SYSTEM AND METHOD FOR OCCUPANCY BASED MANAGEMENT OF DISTRIBUTED SYSTEMS

FIELD DISCLOSED HEREIN

Embodiments disclosed herein relate generally to system management. More particularly, embodiments disclosed herein relate to systems and methods to manage frame occupancy.

BACKGROUND

Computing devices may provide various services. For example, computing devices may host applications that store data, process data, and generate data thereby providing services. Depending on the type of processing performed, hardware and software components available for use in processing, various types of services may be performed.

BRIEF DESCRIPTION OF THE DRAWINGS

Embodiments disclosed herein are illustrated by way of example and not limitation in the figures of the accompanying drawings in which like references indicate similar elements.

FIG. 5 shows a block diagram illustrating a computing device in accordance with an embodiment.

DETAILED DESCRIPTION

Figure 1A:
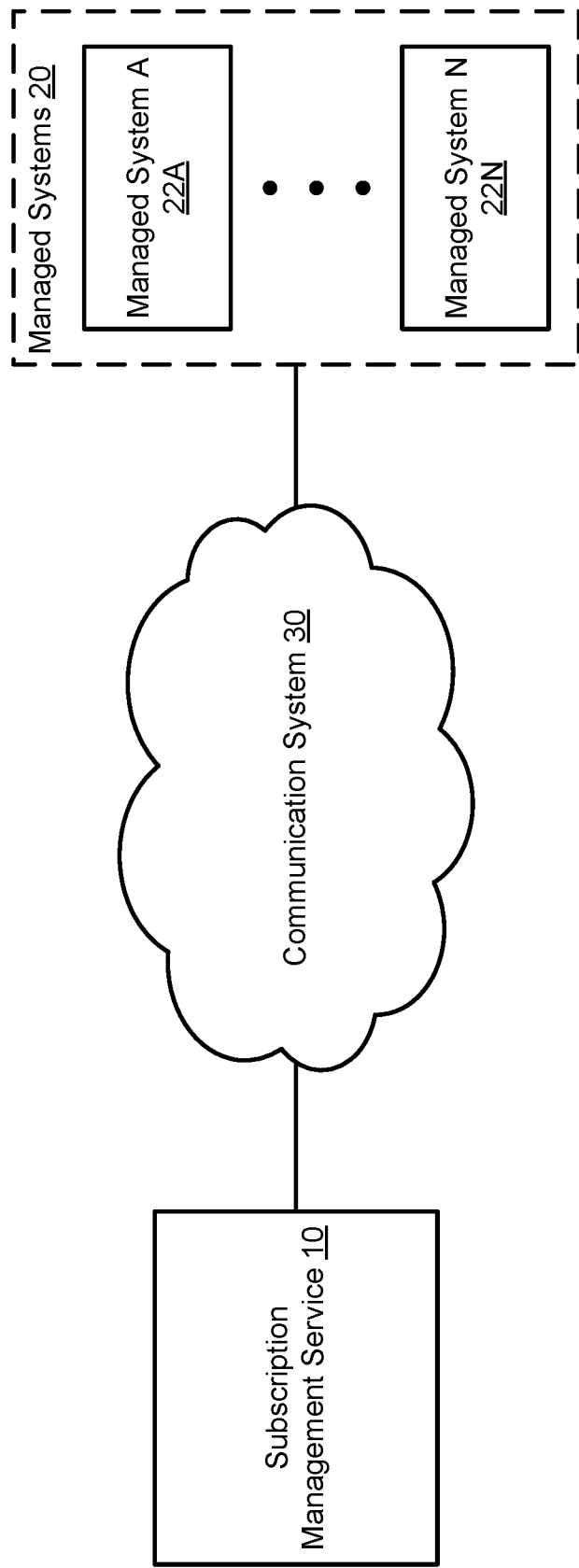
FIG. 1A shows a block diagram illustrating a system in accordance with an embodiment.

Various embodiments disclosed herein will be described with reference to details discussed below, and the accompanying drawings will illustrate the various embodiments. The following description and drawings are illustrative disclosed herein and are not to be construed as limiting the disclosed embodiments. Numerous specific details are described to provide a thorough understanding of various embodiments disclosed herein. However, in certain instances, well-known or conventional details are not described in order to provide a concise discussion of embodiments disclosed herein.

Reference in the specification to "one embodiment" or "an embodiment" means that a particular feature, structure, or characteristic described in conjunction with the embodiment can be included in at least one embodiment disclosed herein. The appearances of the phrase "in one embodiment" and "an embodiment" in various places in the specification do not necessarily all refer to the same embodiment.

References to an "operable connection" or "operably connected" means that a particular device is able to communicate with one or more other devices. The devices themselves may be directly connected to one another or may be indirectly connected to one another through any number of intermediary devices, such as in a network topology.

In general, embodiments disclosed herein relate to methods, systems, and devices for providing computer implemented services using managed systems. The computer implemented services may include any quantity and type of such services.

To provide the computer implemented services, one or more of the managed systems may need to be deployed to a location and operate in a predetermined manner conducive to, for example, execution of applications that provide the computer implemented services. When deployed to a location, the managed systems may be housed in a managed system frame.

To improve the likelihood of the computer implemented services being provided, embodiments disclosed here relate to methods and systems for managing managed systems using a subscription based model and managed system frames. The subscription model may utilize a highly accessible service to obtain information regarding desired capabilities (e.g., a subscription) of a managed system, use the acquired information to automatically configure and manage the features and capabilities of managed systems to meet those desired by users, operators, and/or other persons, and facilitate usage based management of the managed systems.

To facilitate management of managed systems frames, the managed system frames may include one or more system to guide deployment of managed systems to preferred frame units, determine the occupancy of various frame units, and secure the frame units from unexpected deployments to and/or removals of managed systems from managed system frames. By doing so, the managed system frames may be managed remotely and with reduced cognitive burden on persons tasked with physically assisting in management of the managed systems frames.

By doing so, the managed systems may be more likely to be able to provide the computer implemented services actually desired by users over time without interruptions or delays in service due to subscription limits, differences between expected and actual states of manage system frames, and/or other aspects of distributed systems.

In an embodiment, a computer-implemented method for managing a distributed system comprising managed systems and a subscription manager that manages operation of the managed systems is provided. The method may include initiating, by the subscription manager, deployment of a managed system to a managed system frame; selecting, by the subscription manager, a frame unit of the managed system frame for the managed system; selecting, by the subscription manager and based on the selected frame unit, availability indicator states for frame units of the managed system frame; indicating, to a person tasked with installing the managed system in the managed system frame, the selected frame unit using the availability indicator states and availability indicators associated with the frame units; after the managed system is installed in the selected frame unit: selecting, by the subscription manager, updated availability indicator states for the frame units based on presence of the managed system in the selected frame unit; and indicating, to a second person tasked with installing another managed system in the managed system frame, that the selected frame unit and at least a second frame unit are unavailable for the other managed system, the at least a second frame unit is unoccupied.

Selecting the updated availability indicator states may include making a determination that the presence of the managed system in the selected frame unit and presence of the other managed system in the at least the second frame unit will overheat at least one data processing system positioned in the managed system frame; and based on the determination: selecting a first of the updated availability indicator states that is associated with the selected frame unit to indicate that the selected frame unit is unavailable for occupancy; and selecting a second of the updated availability indicator states that is associated with the at least a second frame unit to indicate that the at least a second frame unit is unavailable for occupancy.

Selecting the updated availability indicator states may include making a determination that the presence of the managed system in the selected frame unit and an electrical connector used to power the managed system while in the selected frame unit will create an interference with presence of the other managed system in the at least the second frame unit; and based on the determination: selecting a first of the updated availability indicator states that is associated with the selected frame unit to indicate that the selected frame unit is unavailable for occupancy; and selecting a second of the updated availability indicator states that is associated with the at least a second frame unit to indicate that the at least a second frame unit is unavailable for occupancy.

Selecting the updated availability indicator states may include making a determination that the presence of the managed system in the selected frame unit indicates presence of the other managed system in the at least the second frame unit will prevent a preferred future expansion for the managed system; and based on the determination: selecting a first of the updated availability indicator states that is associated with the selected frame unit to indicate that the selected frame unit is unavailable for occupancy; and selecting a second of the updated availability indicator states that is associated with the at least a second frame unit to indicate that the at least a second frame unit is unavailable for occupancy.

Selecting the updated availability indicator states may include making a determination that the presence of the managed system in the selected frame unit and communication connector used to operably connect the managed system to other data processing devices while in the selected frame unit will create an interference with presence of the other managed system in the at least the second frame unit; and based on the determination: selecting a first of the updated availability indicator states that is associated with the selected frame unit to indicate that the selected frame unit is unavailable for occupancy; and selecting a second of the updated availability indicator states that is associated with the at least a second frame unit to indicate that the at least a second frame unit is unavailable for occupancy.

Each of the updated availability indicator states indicate one of the following selected from an indication state group consisting of: a corresponding frame unit of the managed system frame is occupied and unavailable for any of the managed systems; the corresponding frame unit of the managed system frame is unoccupied and unavailable for any of the managed systems; the corresponding frame unit of the managed system frame is unavailable for any of the managed systems; and the corresponding frame unit of the managed system frame is for a corresponding managed system.

Each of the availability indicators associated with the frame units may be adapted to generate visual indications (e.g., light displays) corresponding to each of the indication states of the indication state group.

In an aspect, a computer-implemented method for managing a distributed system comprising managed systems and a subscription manager that manages operation of the managed systems is provided. The method includes monitoring, by the subscription manager, frame-unit level occupancy of a managed system frame using sensors associated with frame units of the managed system frame; making, by the subscription manager, a comparison between the frame-unit level occupancy of the managed system frame to expected occupancy for the managed system frame; making, by the subscription manager, a determination that the comparison indicates an unexpected occupancy in one of the frame units; in response to the determination: remediating, by the subscription manager, the unexpected occupancy in the one of the frame units; updating, by the subscription manager, the frame-unit level occupancy based on the remediated unexpected occupancy in the one of the frame units to obtain updated frame-unit level occupancy for the managed system; and deploying, by the subscription manager, at least one of the managed systems to the managed system frame based on the updated frame-unit level occupancy of the managed system.

The computer-implemented method may also include providing, by the subscription manager, subscribed to computer implemented services to a user using the deployed at least one of the managed systems.

At least one of the sensors may include a proximity sensor, the proximity sensor being positioned to detect when any of the managed systems are present in a corresponding frame unit of the frame units.

The proximity sensor may be a sensor selected from a group of sensors consisting of a bump sensor, a distance sensor, a capacitance senor, a hall effect sensor, and an infrared radiation sensor.

Remediating the unexpected occupancy may include initiating removal an enclosure from the one of the frame units; and detecting the removal of the enclosure from the one of the frame units using the sensors.

Remediating the unexpected occupancy may also include initiating deployment of the enclosure to another of the frame units; and detecting presence of the enclosure in the other frame unit of the frame units.

Updating the frame-unit level occupancy may include marking the other frame unit of the frame units as being occupied.

Remediating the unexpected occupancy may also include prior to initiating the deployment of the enclosure to the other frame unit of the frame units, confirming, with a user subscribed to use the managed system frame, that the enclosure is authorized to be deployed in the managed system frame.

In an aspect, a computer-implemented method for managing a distributed system comprising managed systems and a subscription manager that manages operation of the managed systems is provided. The method may include obtaining, by the subscription manager, a subscription modification for a user; selecting, by the subscription manager, a managed system to service the subscription modification; selecting, by the subscription manager, a frame unit of frame units of a managed system frame for the managed system; while the managed system is being deployed in the managed system frame, unlocking the selected frame unit; and after the managed system is deployed in the selected frame unit, locking the selected frame unit to secure the managed system in the selected frame unit.

The computer-implemented method may also include updating, by the subscription manager, operation of the managed system deployed in the selected frame unit to provide desired computer implemented services to the user.

The computer-implemented method may further include, prior to deploying the managed system in the selected frame unit, maintaining the selected frame unit as locked to prevent removal and insertion of enclosures.

The selected frame unit may be unoccupied prior to deployment of the managed system in the selected frame unit.

The managed system frame may include an open front that exposes the frame units and facilitates airflow to the deployed managed system in the selected frame unit.

The managed system frame may include a rated power distribution unit that supplies power to devices positioned in the frame units, the rated power distribution unit being subject to errors in power distribution when any of the devices positioned in the frame units present an unexpected electrical load to the rated power distribution unit.

The managed system may present an expected load to the power distribution unit while in the selected frame unit.

The managed system frame may include remotely operable locks corresponding to the frame units.

Each of the remotely operable locks may be adapted to, while locked, present a mechanical interference to insertion of any of managed systems in a corresponding one of the frame units.

Each of the remotely operable locks may include an actuator mechanically coupled to a mechanical element that occupies a portion of the corresponding one of the frame units, and the actuator is adapted to remove the mechanical element from the portion of the corresponding one of the frame units while the respective remotely operable lock is unlocked.

In an embodiment, a non-transitory media may include instructions that when executed by a processor cause one or more of the computer-implemented method to be performed is provided.

In an embodiment, a data processing system may include the non-transitory media and a processor, and may perform one or more of the computer-implemented methods when the computer instructions are executed by the processor is provided.

Turning to FIG. 1A, a block diagram illustrating a system in accordance with an embodiment is shown. The system may provide for automated management of one or more managed systems 20. A managed system may include any number of computing devices that may each include any number of hardware components (e.g., processors, memory modules, storage devices, communications devices, special purposes devices such as accelerators/graphics processing units/application specific integrated circuits, controllers, etc.). The hardware components may support execution of any number and types of applications (e.g., software components). The aggregate operation of all, or a portion, of the hardware components and software components may give rise to an integrated solution, platform, service, etc. able to provide desired computer implemented services.

The computer implemented services may include any number and type of computer implemented services. Computer implemented services may include, for example, database services, data processing services, electronic communication services, and/or any other services that may be provided using one or more computing devices. Other types of computer implemented services may be provided by managed systems 20 without departing from embodiments disclosed herein.

Figure 1B:
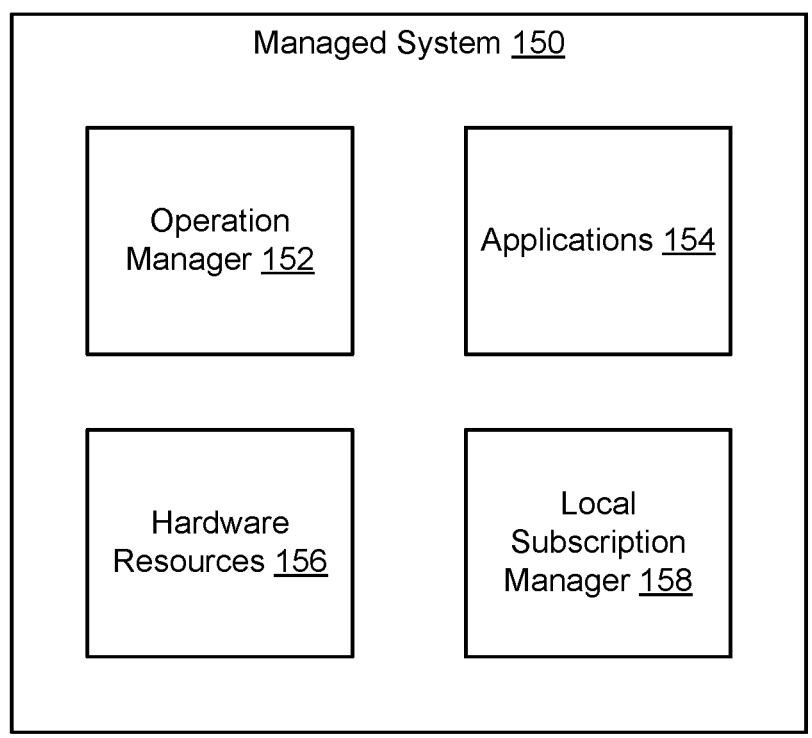
FIG. 1B shows a block diagram illustrating a managed system in accordance with an embodiment.

To provide the aforementioned computer implemented services, any of managed systems 22A, 22N may need to operate in a predetermined manner. For example, certain hardware components may need to be operational and/or certain software components (e.g., applications) may need to be operating for the managed systems to provide computer implemented services (e.g., to operate as a solution). Different configurations of the hardware components and/or applications may need to be implemented by managed systems 20 depending on the computer implemented services desired to be provided by the respective managed systems. Refer to FIG. 1B for additional details regarding managed systems 20.

However, determining these configurations of hardware and/or software components (e.g., applications) necessary for corresponding computer implemented services may be technically challenging to identify. For example, a person may need to be familiar with a range of hardware and software components issues to effectively select the hardware components and/or software components of a system so that the system is capable of providing the desired computer implemented services. Further, if a system is procured that lacks necessary hardware and/or software components, the procured system may not be able to provide its desired functions.

Further, to provide desired functionality using managed systems, any number of managed systems may need to be housed at a desired location such as a client site, a data center environment, etc. Further, the number of managed systems that may need to be housed over time may change. To facilitate housing of managed systems, managed systems frames may be utilized. Managed systems frames may be physical structures for housing managed systems. For example, the managed system frames may be implemented with racks, blade enclosures, and/or other types of mechanical structures for positioning, orienting, supplying utilities to, thermally managed, and/or otherwise managing the physical, electrical, and/or thermal environment in which managed systems may reside.

In general, embodiments disclosed herein relate to system, devices and methods for managing one or more managed systems in a manner that may improve the likelihood of the managed system being able to provide desired computer implemented services. To do so, a system in accordance with embodiments disclosed herein may provide a distributed system for automatically identifying and implementing hardware and/or software configurations of managed systems to support desired computer implemented services. By doing so, embodiments disclosed herein may (i) reduce the cognitive burden for selecting and managing systems to provide desired computer implemented services, (ii) may improve the uptime of desired computer implemented services by making it more likely that managed systems are able to provide the desired services over time, and/or (iii) reducing the cost of obtaining desired computer implemented services by dynamically enabling and/or disabling only those functions/components (which may have associated cost for such functions) necessary to provide the desired computer implemented services.

To provide the above noted functionality, a system in accordance with an embodiment may include subscription management service 10. Subscription management service 10 may facilitate automatic configuration and/or deployment of managed systems 20. To do so, subscription management service 10 may (i) obtain information indicating desired functions of one or more of managed systems 20 and/or hardware components of managed systems 20 to be enabled and/or disabled (and/or information indicating corresponding periods of time of enablement/disablement of hardware/software components), (ii) correlate the desired functions with various hardware components (e.g., if explicit hardware components identifications are not made) and/or software components, (iii) deploy managed systems to particular locations, and/or (iv) provide local subscription managers hosted by managed systems 20 with information regarding the identified hardware components, software components, periods of enablement/disablement, and/or other information to allow the local subscription managers to configure managed systems 20 in a manner that conforms to the information (e.g., subscriptions) obtained by subscription management service 10. In this manner, a user or manager of managed systems 20 may configure managed systems 20 without needing to directly interact with the various hardware and/or software components of managed systems 20.

Further, the distributed system may allow a provider of managed systems 20 to selectively manage various functionalities provided by managed systems 20. By doing so, a provider of managed systems 20 may tailor the functions provided by managed systems 20 (e.g., from all possible functions) to only those requested, desired, and/or procured by an operator, manager, and/or user of managed systems 20.

For example, consider a scenario where a provider of a managed system does so on a contractual basis where a user of the managed system agrees to purchase subscriptions for various functionalities, hardware components, and/or software components. The user may use subscription management service 10 to select to which of the aforementioned features the user wishes to have enabled, to the extent of such enablement, durations of enablement, etc. The contractual basis may be, for example, durations of time, use of certain quantities of resources such as processor cycles, storage space, etc. and/or aggregate services provided by one or more managed systems.

To allow for users or other persons associated with managed systems to elect into such subscriptions, subscription management service 10 may provide graphical user interfaces that allow such selections to be made. The graphical user interfaces may be implemented, for example, as webpages accessible to the users or other persons via other devices (e.g., client devices not illustrated in FIG. 1A but may be operably connected to subscription management service 10 via communication system 30). When an election is made, subscription management service 10 may record the election and send information regarding the elected subscriptions to local subscription managers hosted by managed systems 20 and/or deploy additional/different managed systems to particular locations. Once sent and/or deployed, the local subscription managers may modify the operation of managed systems 20 such that the operation of managed systems 20 matches the elections received and/or recorded by subscription management service.

When providing the aforementioned information regarding subscription elections to local subscription managers, subscription management service 10 may also provide (e.g., collectively "subscription management information"): (i) code blocks or other information (e.g., lists of actions) usable to modify the operation of a managed system to comply with an elected subscription, (ii) limitations on elected subscriptions (e.g., subscription durations, quantities of operations that may be performed under a subscriptions, and/or other metrics for quantifying operation of managed systems 20 limited by a subscription limitation), and/or (iii) code blocks or other information (e.g., lists of actions) usable to revert a previously implemented modification of the operation of a managed system to comply with an elected subscription. By providing the local subscription managers with subscription management information, the local subscription managers may independently enforce the terms of elected subscriptions on managed systems even when, for example, one or more of the local subscription managers are unable to communicate with subscription management service 10 (e.g., after receiving the subscription management information).

When configured and providing computer implemented services, managed systems 20 may be impacted by the placement of other systems near them, improper placement of managed systems in a managed system frame (e.g., at locations that may reduce the effectiveness of thermal management, power distribution, etc.), and/or insertion of other types of devices in managed system frames. To reduce the likelihood of being impacted by such placement, the managed system frames may be actively managed by subscription management service 10. To do so, subscription management service 10 may (i) obtain information regarding devices positioned in managed system frames, (ii) guide deployment of managed systems to particular frame units of managed systems frames that are less likely to impact other managed systems, and/or (iii) prevent insertion and/or removal of managed system to or from various frame units of the managed system frames. Consequently, the managed systems may be more likely to be able to provide desired services by reducing the impacts of positioning of other devices nearby. For additional details regarding subscription management service 10, refer to FIG. 1D.

By doing so, embodiments disclosed herein may provide a distributed system management model that is more likely to provide desired services to user by improving the likelihood that managed systems used to provide the services operate as expected. Consequently, the disclosed distributed systems may be more likely to ensure that desired services are provided even the managed systems are deployed to locations where various persons may be able to physically interact with the managed systems.

Any of subscription management service 10 and managed systems 20 may be implemented with a computing device such as a host or server, a personal computer (e.g., desktops, laptops, and tablets), a "thin" client, a personal digital assistant (PDA), a Web enabled appliance, or a mobile phone (e.g., Smartphone), and/or any other type of data processing device or system. For additional details regarding computing devices, refer to FIG. 5.

In an embodiment, one or more of subscription management service 10 and managed systems 20 are operably connected via communication system 30. Communication system 30 may allow any of subscription management service 10 and managed systems 20 to communicate with one another (and/or with other devices not illustrated in FIG. 1A). To provide its functionality, communication system 30 may be implemented with one or more wired and/or wireless networks. Any of these networks may be a private network (e.g., the "Network" shown in FIG. 5), a public network, and/or may include the Internet. For example, managed systems 20 may be operably connected to subscription management service 10 via the Internet. Subscription management service 10, managed systems 20, and/or communication system 30 may be adapted to perform one or more protocols for communicating via communication system 30.

While illustrated in FIG. 1A with a limited number of specific components, a system may include additional, fewer, and/or different components without departing from embodiments disclosed herein.

Turning to FIG. 1B, a block diagram illustrating managed system 150 in accordance with an embodiment is shown. Managed system 150 may be similar to any of managed systems 20 shown in FIG. 1A. Managed system 150 may provide desired computer implemented service by allowing for its automatic reconfiguration over time based on subscriptions maintained by subscription management service 10, shown in FIG. 1A.

In addition (and/or alternatively) to any of the components shown in FIG. 5, managed system 150 may include operation manager 152, applications 154, hardware resources 156, and local subscription manager 158. Each of these components is discussed below.

Operation manager 152 may generally manage operation of the component of managed system 150, except for local subscription manager 158. For example, operation manager 152 may be implemented with an operating system used to manage hardware resources 156 of managed system 150 to facilitate execution of applications 154. Operation manager 152 may also include, for example, a startup manager such as a basic input output system (BIOS) used to prepare managed system 150 to boot to an operating system or other type of operation management entity. For example, the startup manager may perform various administrative functions such as (i) identifying the hardware resource 156 and (ii) preparing the hardware resources 156 for use. Once prepared, the startup manager may handoff management of managed system 150 to the operating system or other type of management entity to place managed system 150 in a predetermined operating system conducive to applications 154 providing their functionalities. Prior to hand off, managed system 150 may not be in an operating state in which applications 154 may provide all, or a portion, of their functionalities.

Applications 154 may provide all, or a portion, of the computer implemented services desired by a user, operator, or other person associated with managed system 150. Applications 154 may utilize hardware resources 156 to provide their respective functionalities. Operation manager 152 may mediate presentation of hardware resources 156 by, for example, scheduling use, managing discontinuous access, and/or performing other actions to coordinate use of hardware resources 156 by applications 154 (and/or other entities).

In an embodiment, one or more of operation manager 152 and applications 154 is implemented using a hardware device including circuitry. The hardware device may be, for example, a digital signal processor, a field programmable gate array, or an application specific integrated circuit. The circuitry may be adapted to cause the hardware device to perform the functionality of one or more of operation manager 152 and applications 154. One or more of operation manager 152 and applications 154 may be implemented using other types of hardware devices without departing embodiment disclosed herein.

In an embodiment, one or more of operation manager 152 and applications 154 is implemented using a processor adapted to execute computing code stored on a persistent storage that when executed by the processor performs the functionality of one or more of operation manager 152 and applications 154 discussed throughout this application. The processor may be a hardware processor including circuitry such as, for example, a central processing unit, a processing core, or a microcontroller. The processor may be other types of hardware devices for processing information without departing embodiment disclosed herein.

Hardware resources 156 may include any type and quantity of hardware devices usable to provide computer implemented services. Hardware resources 156 may provide their functionality by, for example, consuming power to perform various actions that result in the performance of operation manager 152, applications 154, and/or other entities not shown in FIG. 1B. As part of their respective operation, hardware resources 156 may host firmware and/or may otherwise be programmable to facilitate their respective operation.

Local subscription manager 158 may provide subscription management services. Subscription management services may include (i) obtaining information regarding subscriptions, (ii) performing one or more actions to implement the subscriptions, (iii) storing information regarding the subscriptions in a location accessible to local subscription manager 158, (iv) monitoring operation of managed system 150 based on subscription information (e.g., specified by the information regarding the subscriptions) to obtain, for example, use data, (v) providing use data to the subscription management service, and (vi) based on the monitoring, performing one or more actions to force managed system 150 to comply with the subscriptions (or lack thereof) once managed system 150 may in the future and/or is currently exceeding one or more subscription limitations. The one or more actions to implement the subscriptions may include, for example, (a) activing various deactivated hardware resources, (b) loading various information into storage and/or memory of managed system 150, (c) causing processors or other devices of hardware resources 156 to execute various code blocks to cause them to perform certain operations, and/or (d) any other types of actions to implement changes to managed system 150 to comply with a subscription. Likewise, the one or more actions to force managed system 150 to comply with the subscriptions may include (I) disabling various activated hardware resources, (II) removing various information from storage and/or memory of managed system 150, (III) causing processor or other devices of hardware resources 156 to execute other code blocks to cause them to perform certain operations to revert previous changes to the operation of managed system 150 and/or remove certain functionalities, and/or (IV) any other types of actions to implement changes to managed system 150 to comply with a subscription or lack thereof.

By providing its functionality, local subscription manager 158 may manage the configuration, behavior, and/or functionality of managed system 150 in a manner that automatically conforms it to match that expected by subscription management service 10. As part of the aforementioned process, local subscription manager 158 and subscription management service 10 may cooperate to enforce subscriptions on managed system 150. Local subscription manager 158 and subscription management service 10 may also perform one or more authentications of one another and/or communications from these components to prevent other entities from interfering with the cooperative operation of local subscription manager 158 and subscription management service 10.

In an embodiment, local subscription manager 158 is implemented with an out of band management controller. The out of band management controller may be hosted by managed system 150, be operably connected to hardware resources 156 (e.g., via interconnect 510, shown in FIG. 5), and may operate independently from other components (e.g., hardware and software) of managed system 150. The management controller may include functionality to manage the operation, configuration, and/or other characteristic of any hardware and/or software component of managed system 150. For example, the management controller may include functionality to disable/enable components, reconfigure components, add new components (e.g., load additional applications for execution), etc.

In an embodiment, the management controller includes a separate communication interface (e.g., from that of a communication interface of managed system 150) through which it communicates with subscription management service 10. In an embodiment, the management controller uses the same communication interface which managed system 150 uses to communicate with other devices. Either of these communication interface may facilitate communications with communication system 30, and devices connected to communication system 30.

Figure 1C:
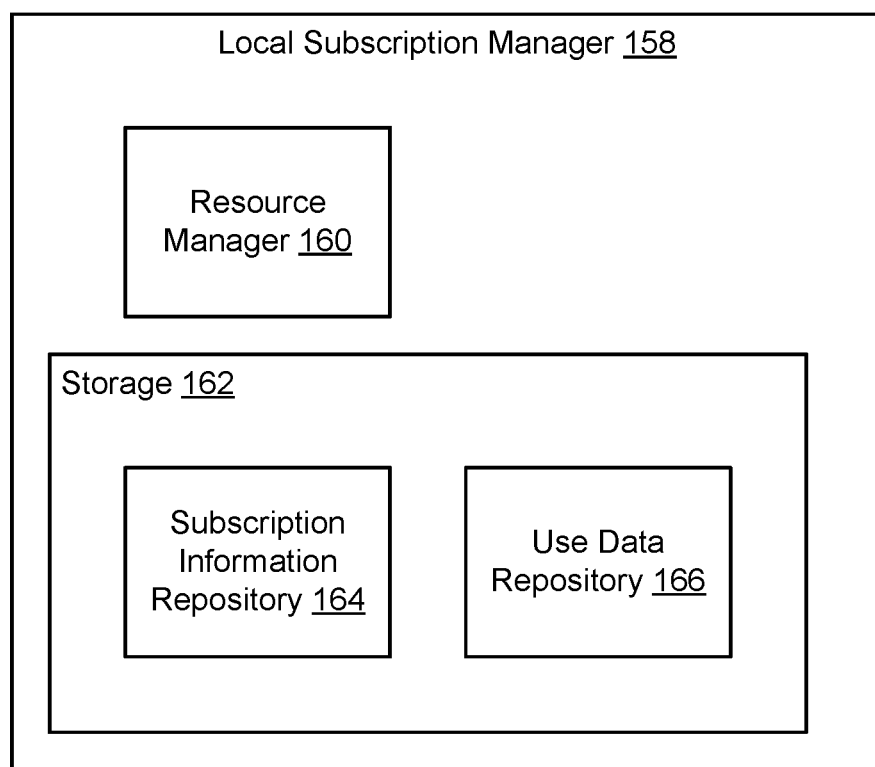
FIG. 1C shows a block diagram illustrating a local subscription manager in accordance with an embodiment.
Figure 3A:
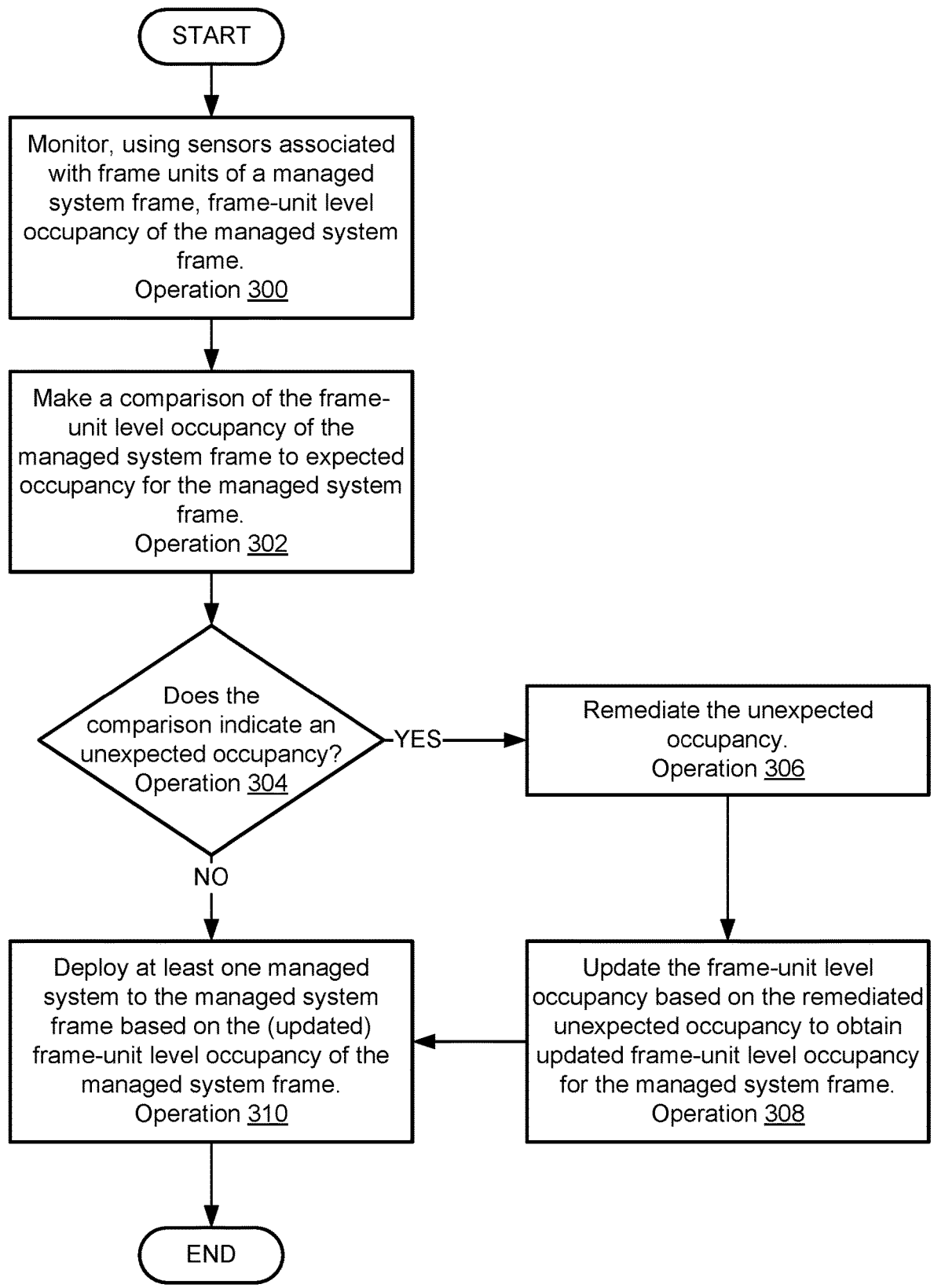
FIG. 3A shows a flow diagram illustrating a method of managing occupancy of frame units of managed systems in accordance with an embodiment.
Figure 3B:
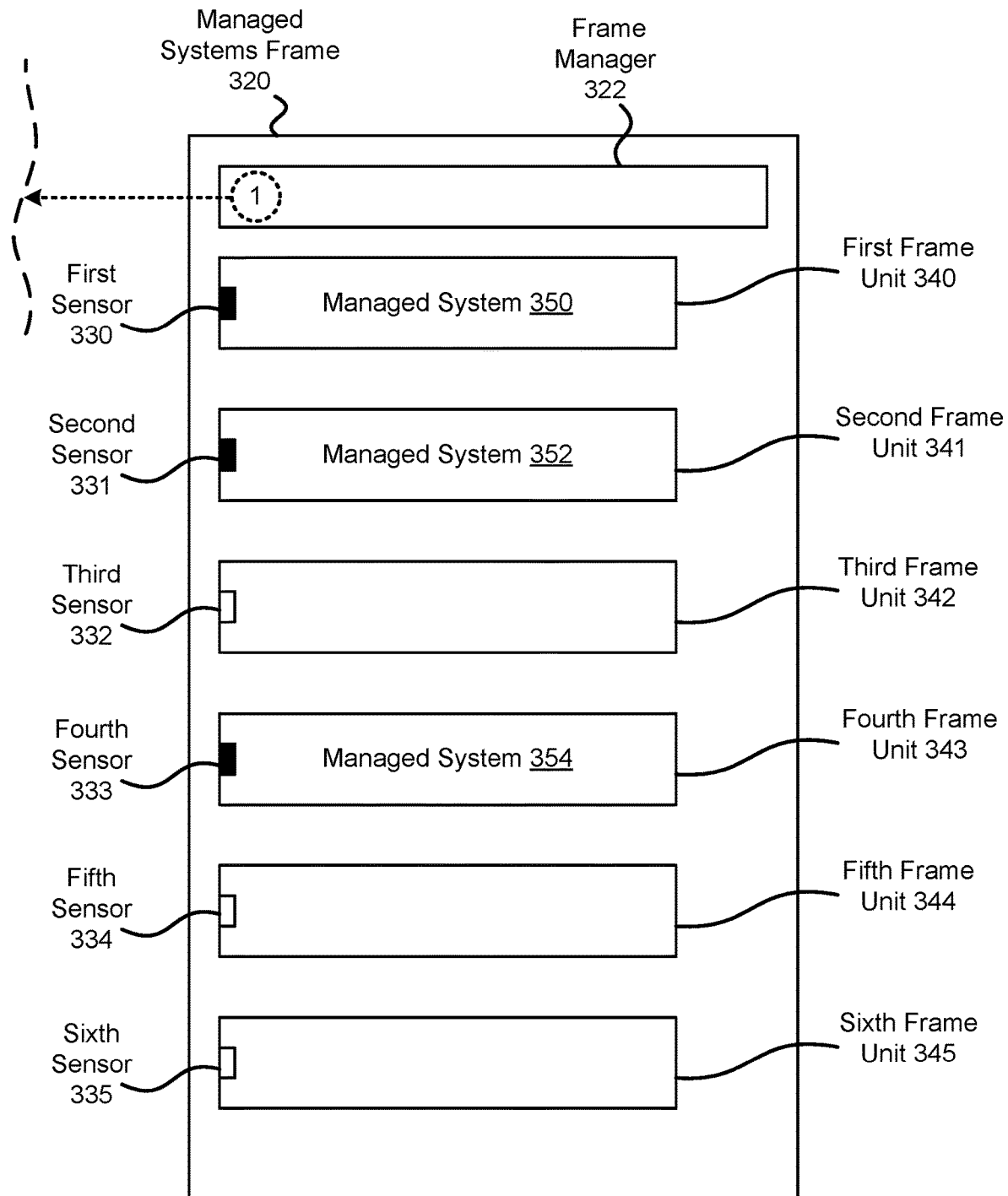
FIGS. 3B-3E show diagrams illustrating interactions between and actions of components of a system in accordance with an embodiment.
Figure 3C:
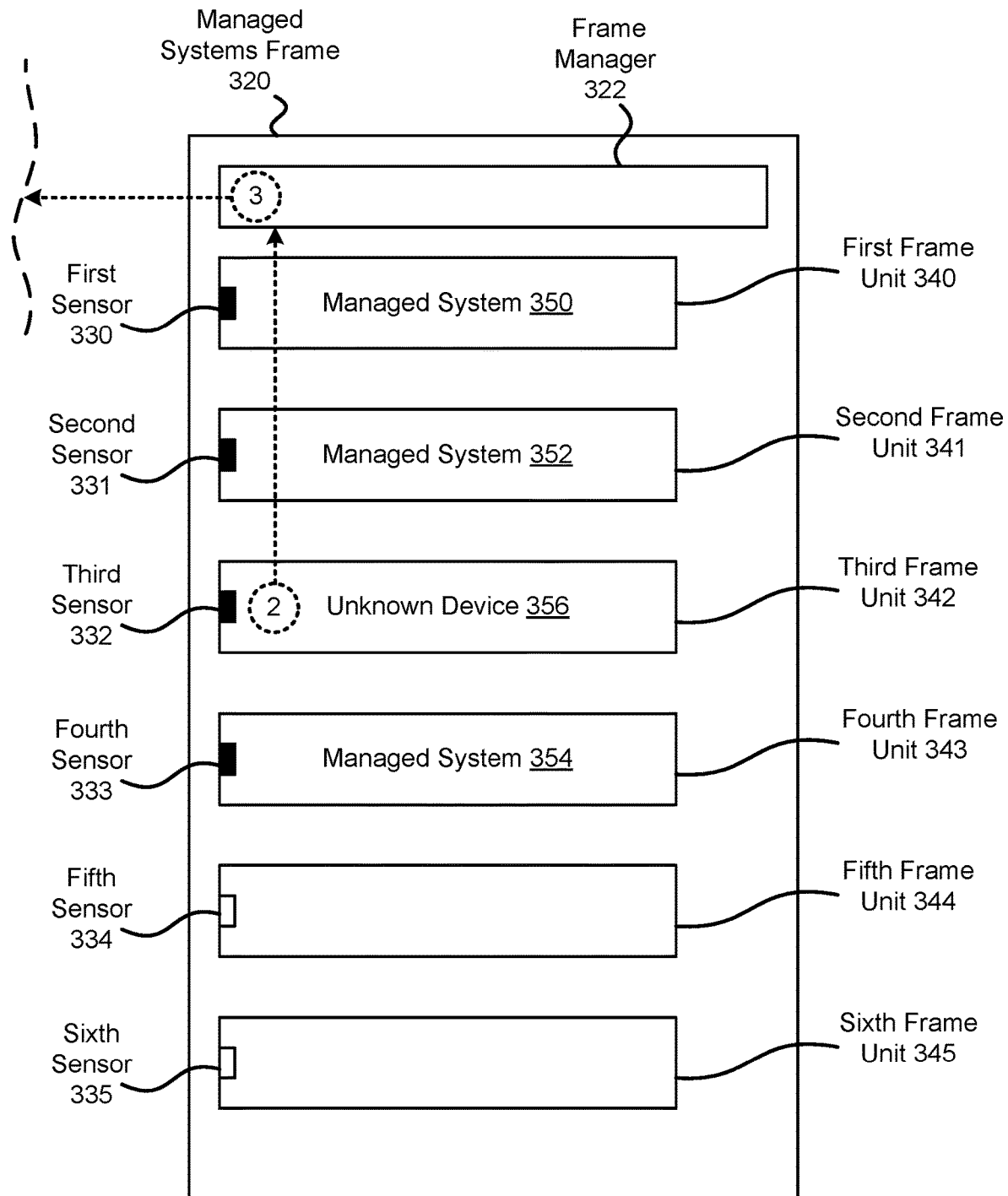
Figure 3D:
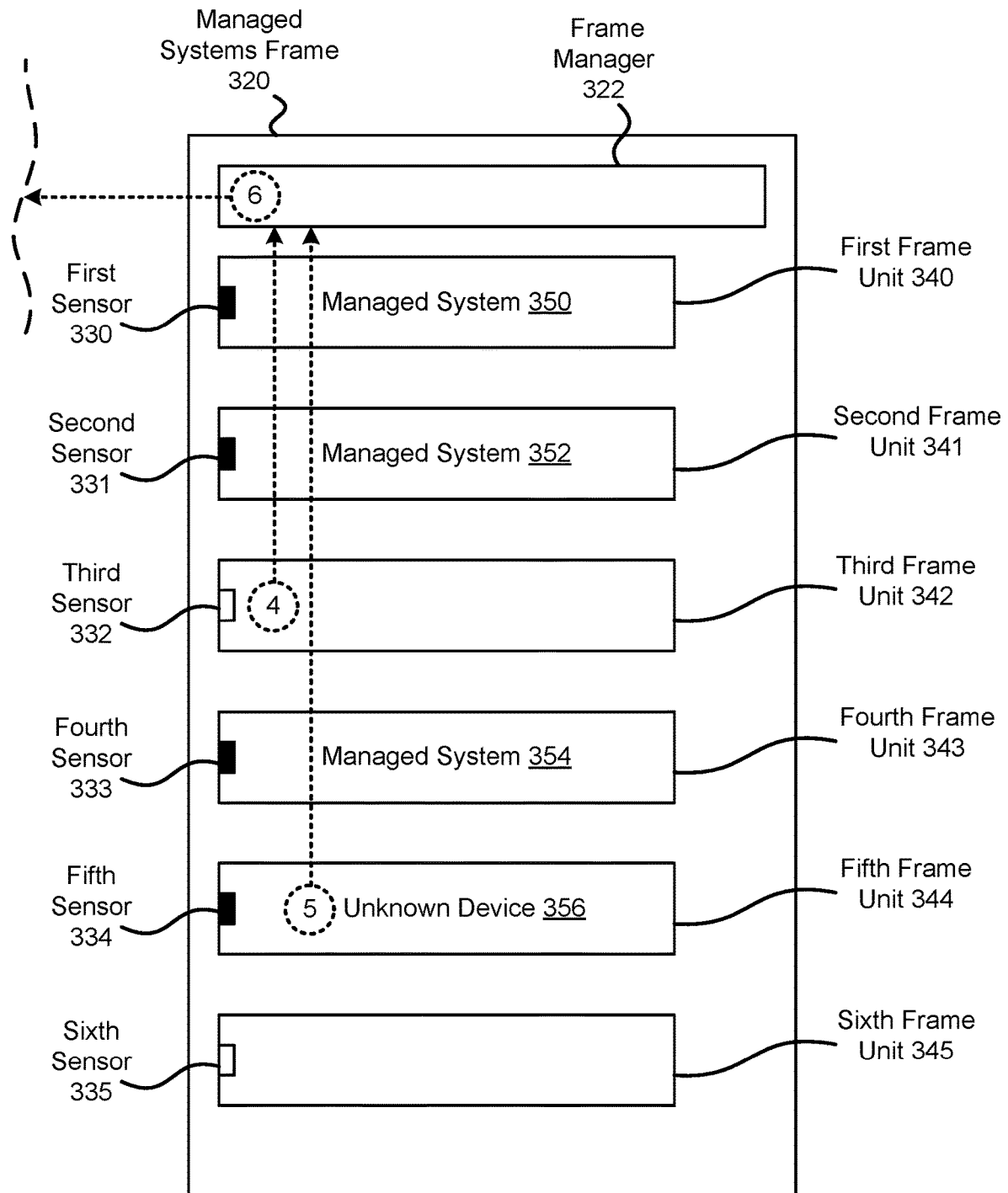
Figure 3E:
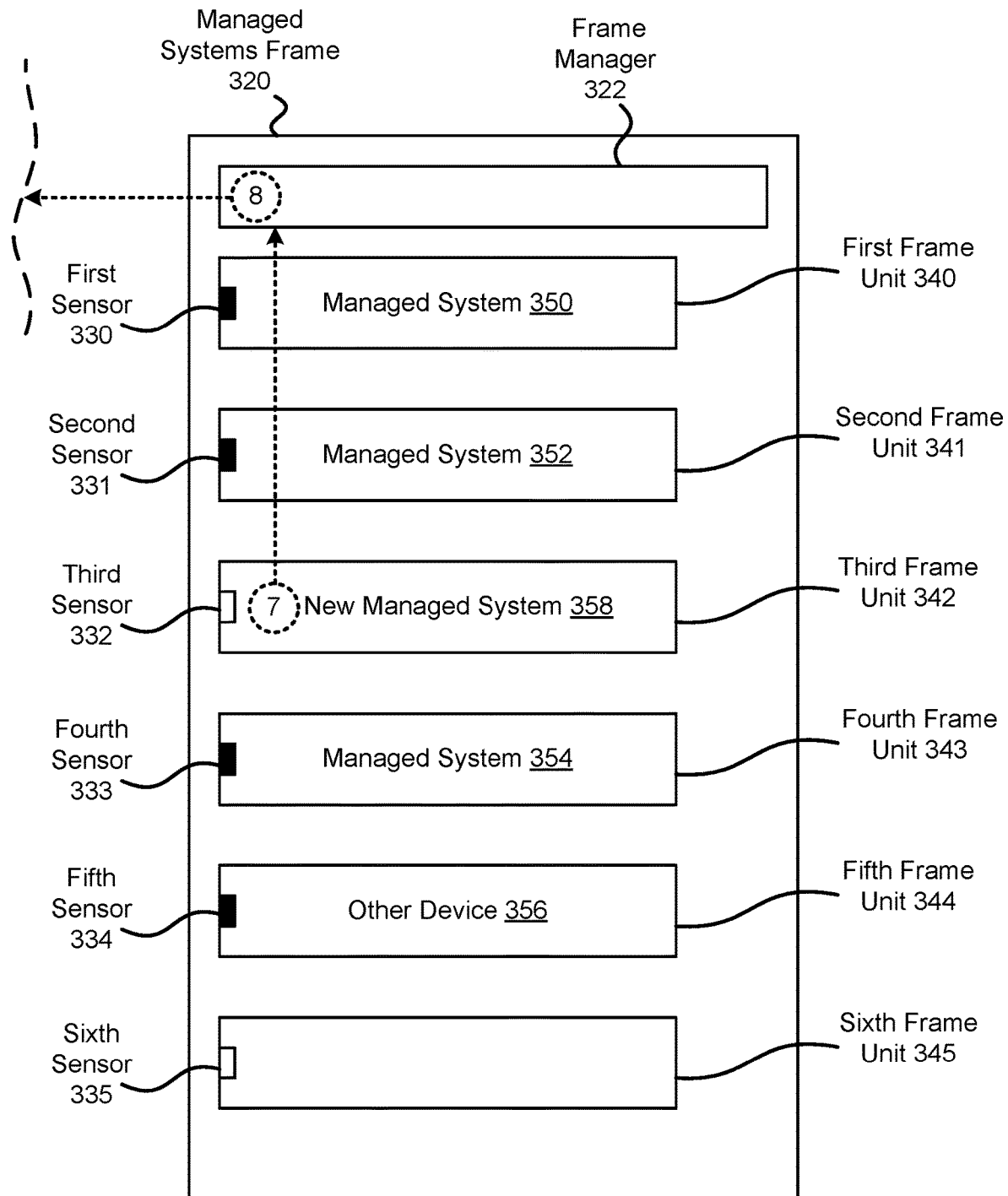
Figure 4A:
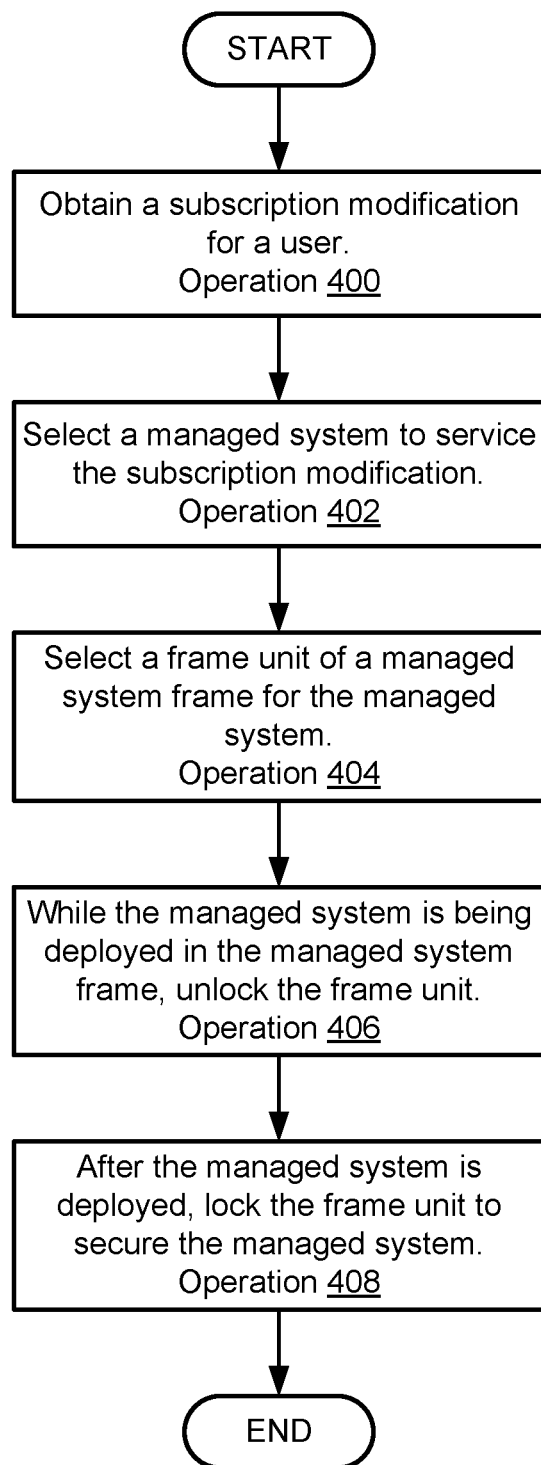
FIG. 4A shows a flow diagram illustrating a method of securing a managed system frame in accordance with an embodiment.
Figure 4B:
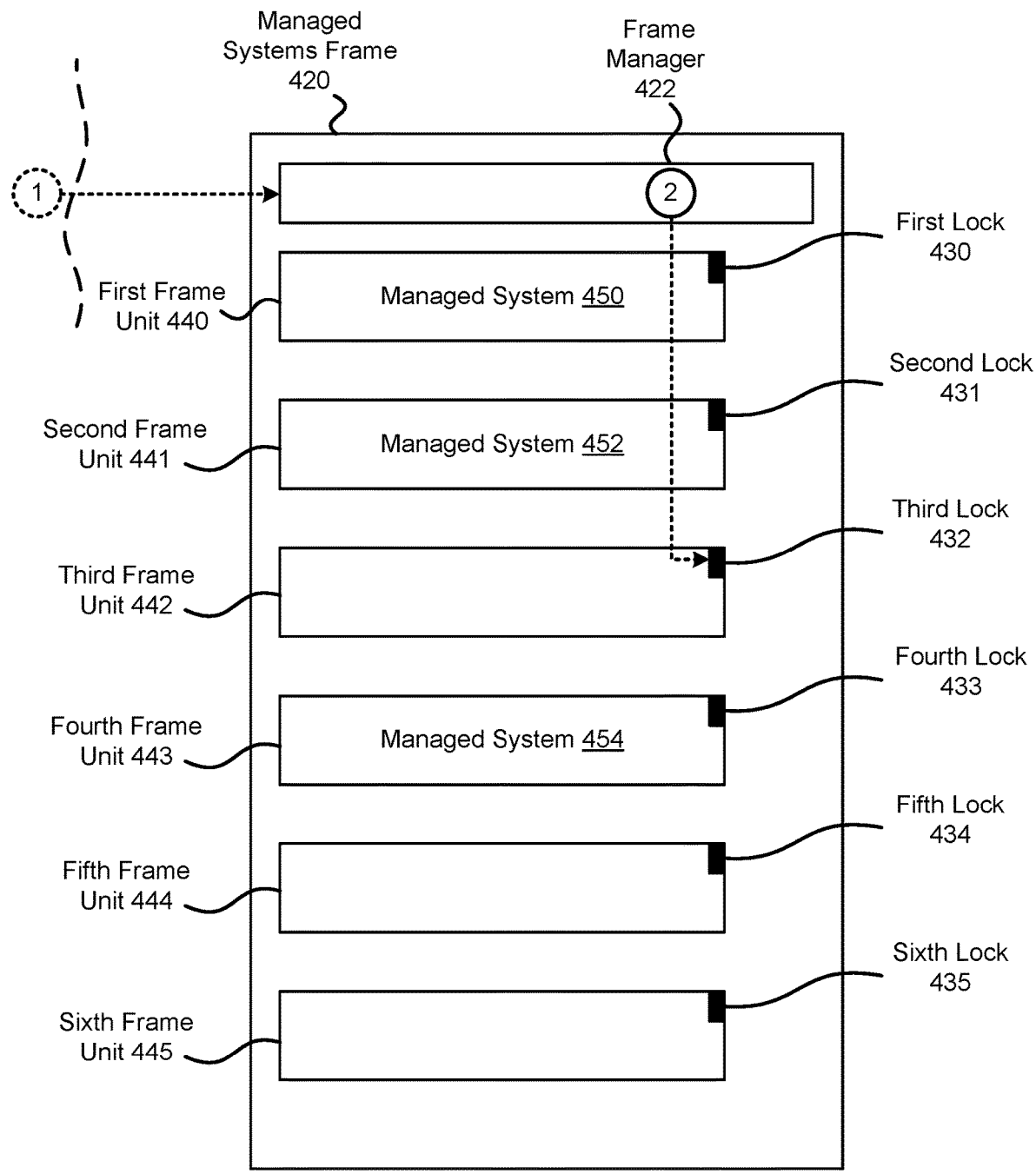
FIGS. 4B-4E show diagrams illustrating interactions between and actions of components of a system in accordance with an embodiment.

When providing its functionality, local subscription manager 158 may perform all, or a portion, of the methods and operations illustrated in FIGS. 2-3 and/or actions shown in and/or described with respect to FIGS. 4A-4B. Refer to FIG. 1C for additional details regarding local subscription manager 158.

Managed system 150 may also include a form factor compliant enclosure (not shown). The enclosure may allow managed system 150 to be positioned in a managed system frame adapted to house the form factor compliant enclosure (or multiple of such enclosures). For example, managed system frame may be implemented with a rack and the form factor compliant enclosure may be a rack enclosure or other type of chasses which may be received by a frame unit (e.g., a rack unit) of the rack. Refer to FIGS. 1E-1F for additional details regarding managed system racks.

While illustrated in FIG. 1B with a limited number of specific components, a managed system may include additional, fewer, and/or different components without departing from embodiments disclosed herein.

Turning to FIG. 1C, a block diagram of local subscription manager 158 in accordance with an embodiment is shown. Local subscription manager 158 may be implemented with a computing device similar to that illustrated in FIG. 5. In addition (and/or alternatively) to any of the components shown in FIG. 5, local subscription manager 158 may include resource manager 160 and storage 162. Each of these components is discussed below.

Resource manager 160 may include functionality to (i) establish secure connections with and/or authenticate subscription management service 10, (ii) obtain information from subscription management service 10 via the secure connections, (iii) update subscription information repository 164 based on the obtained information, (iv) modify the configuration, function, and/or operation of a managed system that hosts local subscription manager 158 to conform to the information stored in subscription information repository 164, (v) monitor use of subscribed to services provided by the host managed system, and (vi) report the use of such services provided by the host managed system to the subscription management system.

In an embodiment, resource manager 160 is implemented using a hardware device including circuitry. The hardware device may be, for example, a digital signal processor, a field programmable gate array, or an application specific integrated circuit. The circuitry may be adapted to cause the hardware device to perform the functionality of resource manager 160. Resource manager 160 may be implemented using other types of hardware devices without departing embodiment disclosed herein.

In one embodiment, resource manager 160 is implemented using a processor adapted to execute computing code stored on a persistent storage that when executed by the processor performs the functionality of resource manager 160 discussed throughout this application. The processor may be a hardware processor including circuitry such as, for example, a central processing unit, a processing core, or a microcontroller. The processor may be other types of hardware devices for processing information without departing embodiment disclosed herein.

In an embodiment, storage 162 is implemented using physical devices that provide data storage services (e.g., storing data and providing copies of previously stored data). The devices that provide data storage services may include hardware devices and/or logical devices. For example, storage 162 may include any quantity and/or combination of memory devices (i.e., volatile storage), long term storage devices (i.e., persistent storage), other types of hardware devices that may provide short term and/or long term data storage services, and/or logical storage devices (e.g., virtual persistent storage/virtual volatile storage).

For example, storage 162 may include a memory device (e.g., a dual in line memory device) in which data is stored and from which copies of previously stored data are provided. In another example, storage 162 may include a persistent storage device (e.g., a solid-state disk drive) in which data is stored and from which copies of previously stored data is provided. In a still further example, storage 162 may include (i) a memory device (e.g., a dual in line memory device) in which data is stored and from which copies of previously stored data are provided and (ii) a persistent storage device that stores a copy of the data stored in the memory device (e.g., to provide a copy of the data in the event that power loss or other issues with the memory device that may impact its ability to maintain the copy of the data cause the memory device to lose the data).

Storage 162 may also be implemented using logical storage. A logical storage (e.g., virtual disk) may be implemented using one or more physical storage devices whose storage resources (all, or a portion) are allocated for use using a software layer. Thus, a logical storage may include both physical storage devices and an entity executing on a processor or other hardware device that allocates the storage resources of the physical storage devices.

Generally, storage 162, and the data stored therein, may not be accessible to a managed system that hosts local subscription manager 158.

Storage 162 may store data structures including subscription information repository 164 and use data repository 166. Each of these data structures is discussed below.

Subscription information repository may be implemented with one or more data structures that store information regarding subscriptions for a device that hosts local subscription manager 158. The information may allow resource manager 160 to enforce various configurations on a host managed system to conform that operation of the host managed system to meet subscription limitations. For example, subscription information repository 164 may include code blocks usable to force a host managed system (e.g., by initiating execution of the code blocks) to enable/disable various hardware components, software components, adopt various configurations, and/or otherwise conform its operation to that necessary for desired computer implemented services to be provided. Such actions may be invoked when corresponding subscription limits are reached.

Use data repository 166 may be implemented with one or more data structures that store information regarding use of the services provided by the host managed system. The use data may include quantities of services utilized by a user (e.g., absolute quantities, use rates, and/or other types of information regarding use of such services by subscribed entities), quantities of computing resources consumed by services provided to a user, and/or other information usable to quantify use of a host managed system or services provided by the host managed system. The information included in use data repository 166 may be maintained by resource manager 160 which may monitor the operation of a host managed system to obtain the information. The information may be reported to a subscription management service, and also may be used to ascertain whether subscription limits have been reached.

While various data structures have been illustrated and described in FIG. 1C, any of the data structures may be implemented with any type of structure (e.g., lists, tables, linked lists, databases, etc.), stored in different locations, and/or spanned across any number of devices without departing from embodiments disclosed herein. For example, any of the data structures shown in FIG. 1C may be stored remotely to local subscription manager 158 (e.g., in a storage of a host device, a cloud resource, etc.) in a manner that is still accessible to local subscription manager 158.

While illustrated in FIG. 1C with a limited number of specific components, a local subscription manager may include additional, fewer, and/or different components without departing from embodiments disclosed herein.

Figure 1D:
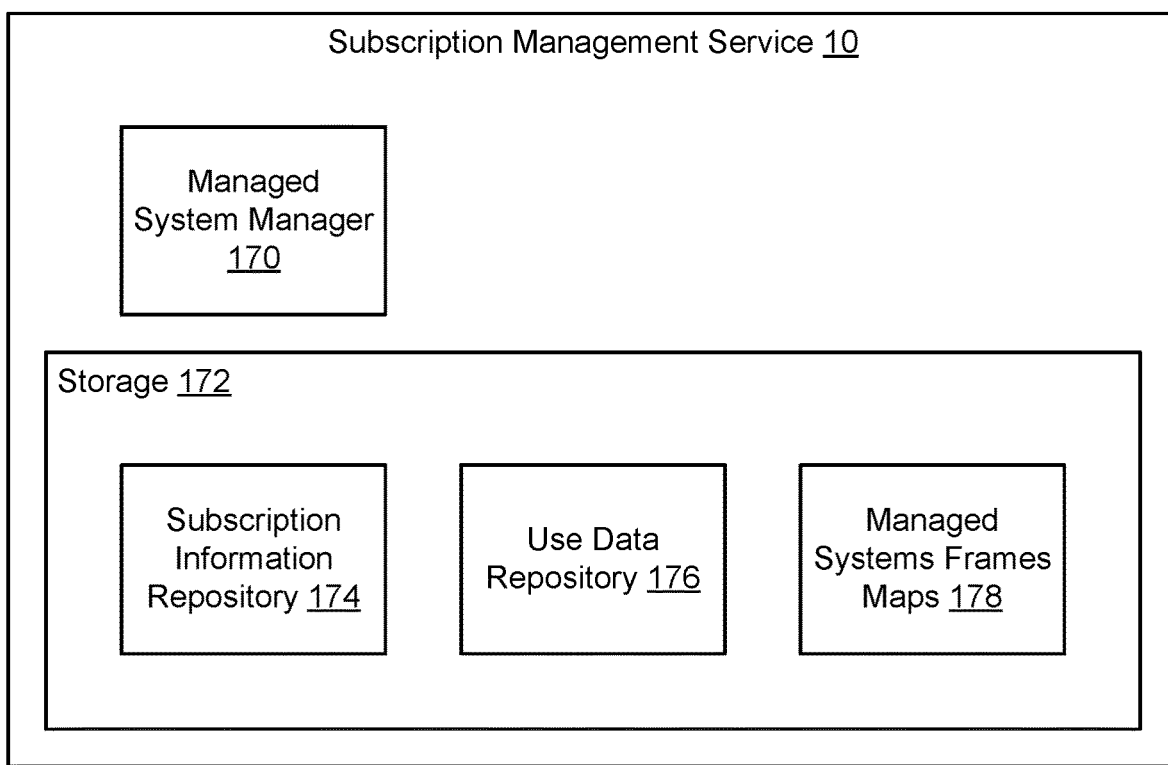
FIG. 1D shows a block diagram illustrating a subscription management service in accordance with an embodiment.
Figure 1E:
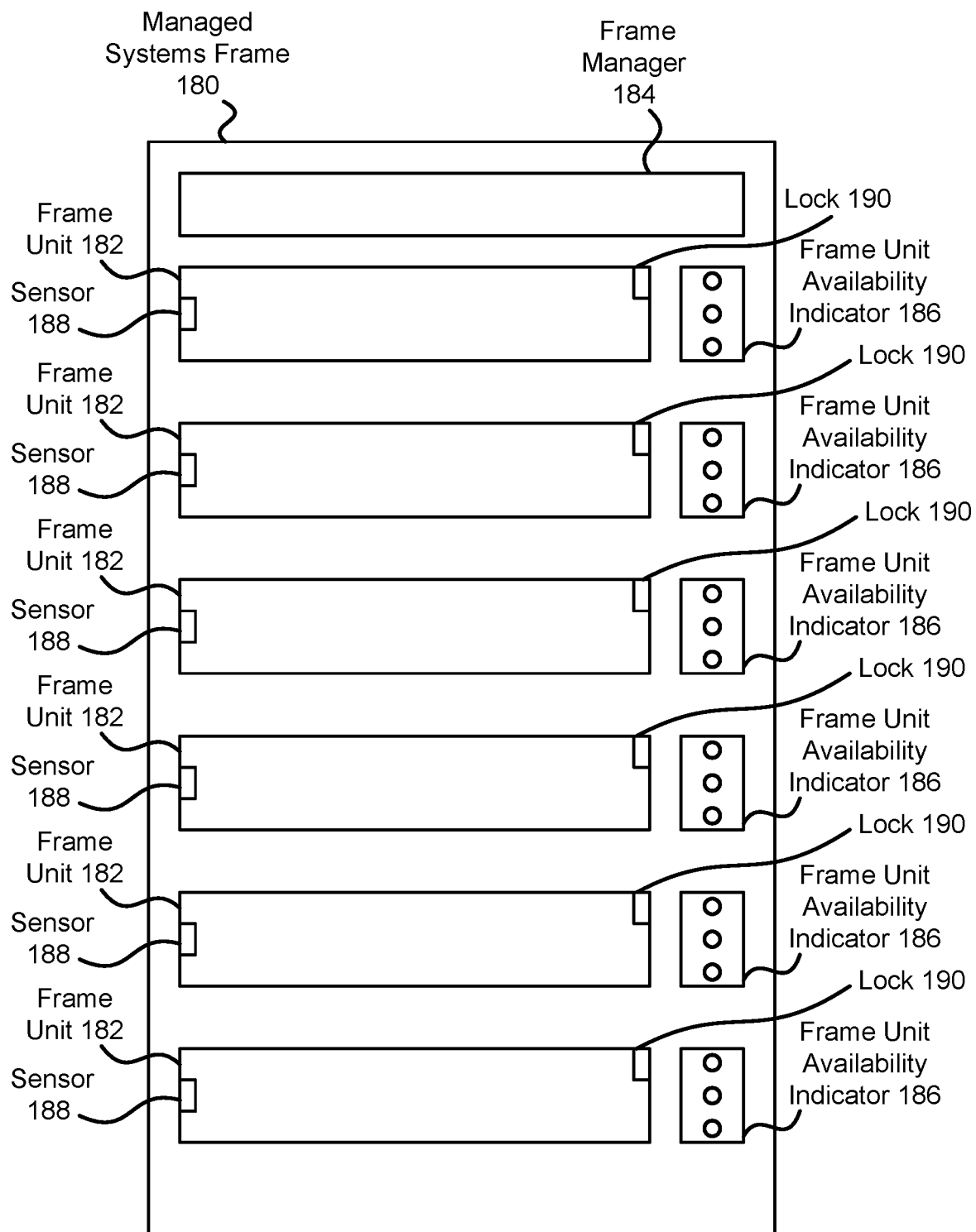
FIG. 1E shows a diagram illustrating a managed system in accordance with an embodiment.
Figure 1F:
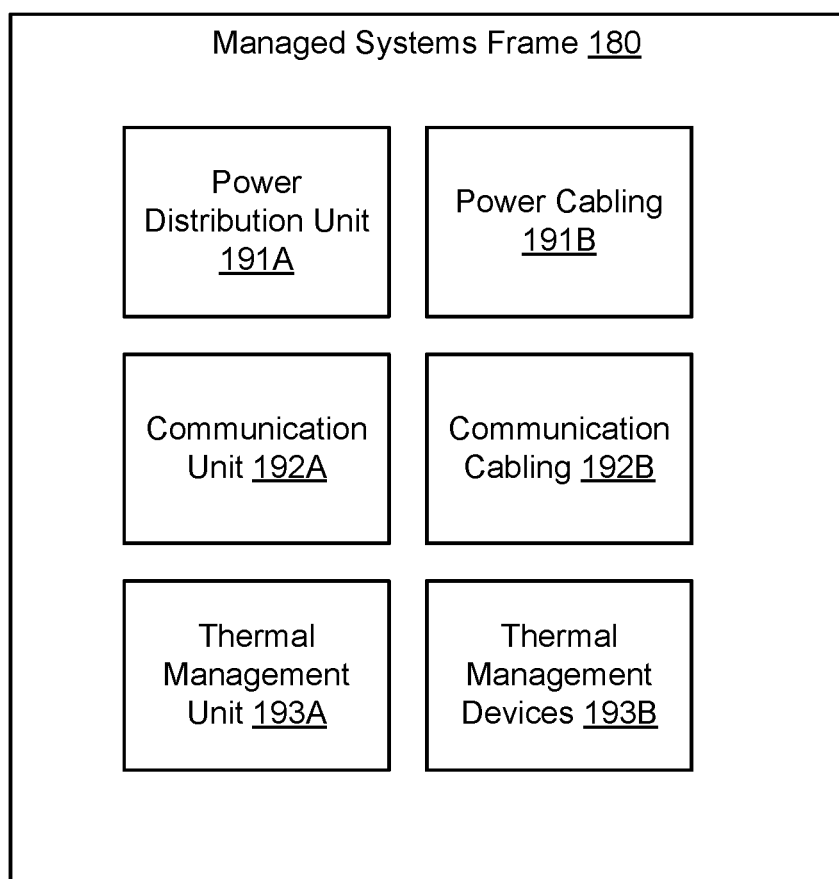
FIG. 1F shows a block diagram illustrating the managed system in accordance with an embodiment.

Turning to FIG. 1D, a block diagram of subscription management service 10 in accordance with an embodiment is shown. As discussed above, subscription management service 10 may manage the operation of managed systems based on subscriptions. To provide its functionality, subscription management service may include managed system manager 170 and storage 172. Each of these components is discussed below.

Managed system manager 170 may include functionality to (i) obtain subscription information for various users of managed systems (e.g., an use the subscription information to managed various managed systems), (ii) provide information regarding use of the managed systems by the user to the users, (iii) provide the users of the managed systems information regarding their use of the managed systems and/or limitations thereof, and/or (iv) automatically and/or at the direction of user of managed systems, modify subscriptions for the users to improve the likelihood that the managed systems provide computer implemented services desired by user of the managed systems.

Managed system manager 170 may also actively manage the managed system frames in which the managed systems are positioned. To actively manage the managed system frames, managed system manager 170 may (i) obtain information regarding the occupancy status of frame units of the managed system frames, (ii) provide visual indications of where managed systems (and/or other devices) should or should not be deployed to managed system racks, and (iii) manage the occupancy of frame units by locking and/or unlocking the frame units to deployment of devices such as managed systems.

To decide where (e.g., frame units) managed systems should be deployed in managed system frames, managed system manager 170 may take into account a variety of factors including, for example, (i) existing occupancy of frame units, (ii) impacts that potential occupancy of frame units may have other devices already deployed to other frame units, (iii) physical devices such as power and/or communication cables which may be impacted (e.g., moved, strained, etc.) by deployment of managed systems to frame units, (iv) impacts on thermal management capabilities of managed system frames based on potential deployments of managed systems to various frame units, and/or (v) future potential deployment needs (e.g., such as likelihood of additional managed systems that may need to deployed proximate to already deployed managed systems to provide expanded capabilities or functionalities). Managed system manager 170 may take into account other factors when deciding how to manage the frame units of managed system frames.

In an embodiment, when a deployment decision for a managed system is made, managed system manager 170 may attempt to minimize the impact of the deployment of the managed system on a host managed system frame, and devices deployed therein. To make such decisions, managed system manager 170 may utilize an inference model, heuristic information, and/or other methods.

Figure 2A:
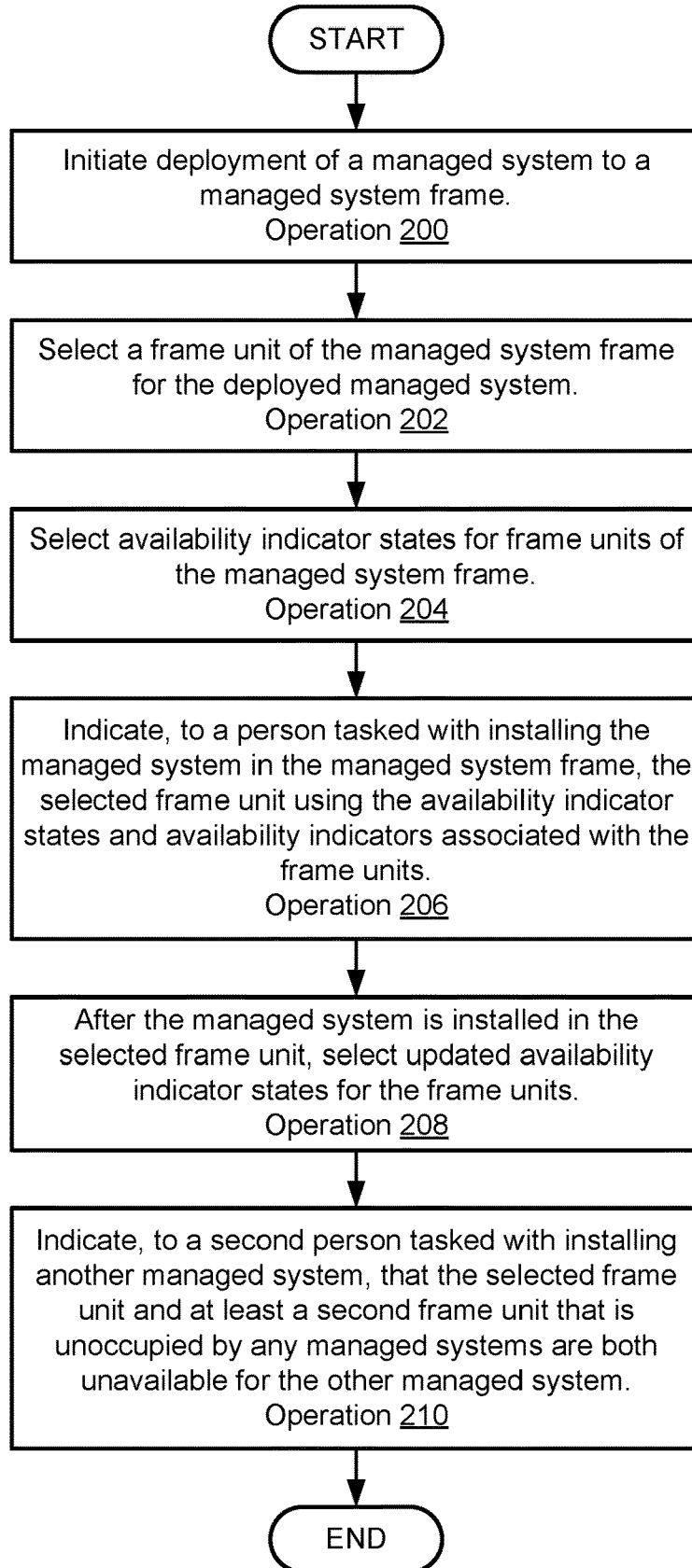
FIG. 2A shows a flow diagram illustrating a method of managing deployment of managed systems to a managed system frame in accordance with an embodiment.
Figure 2B:
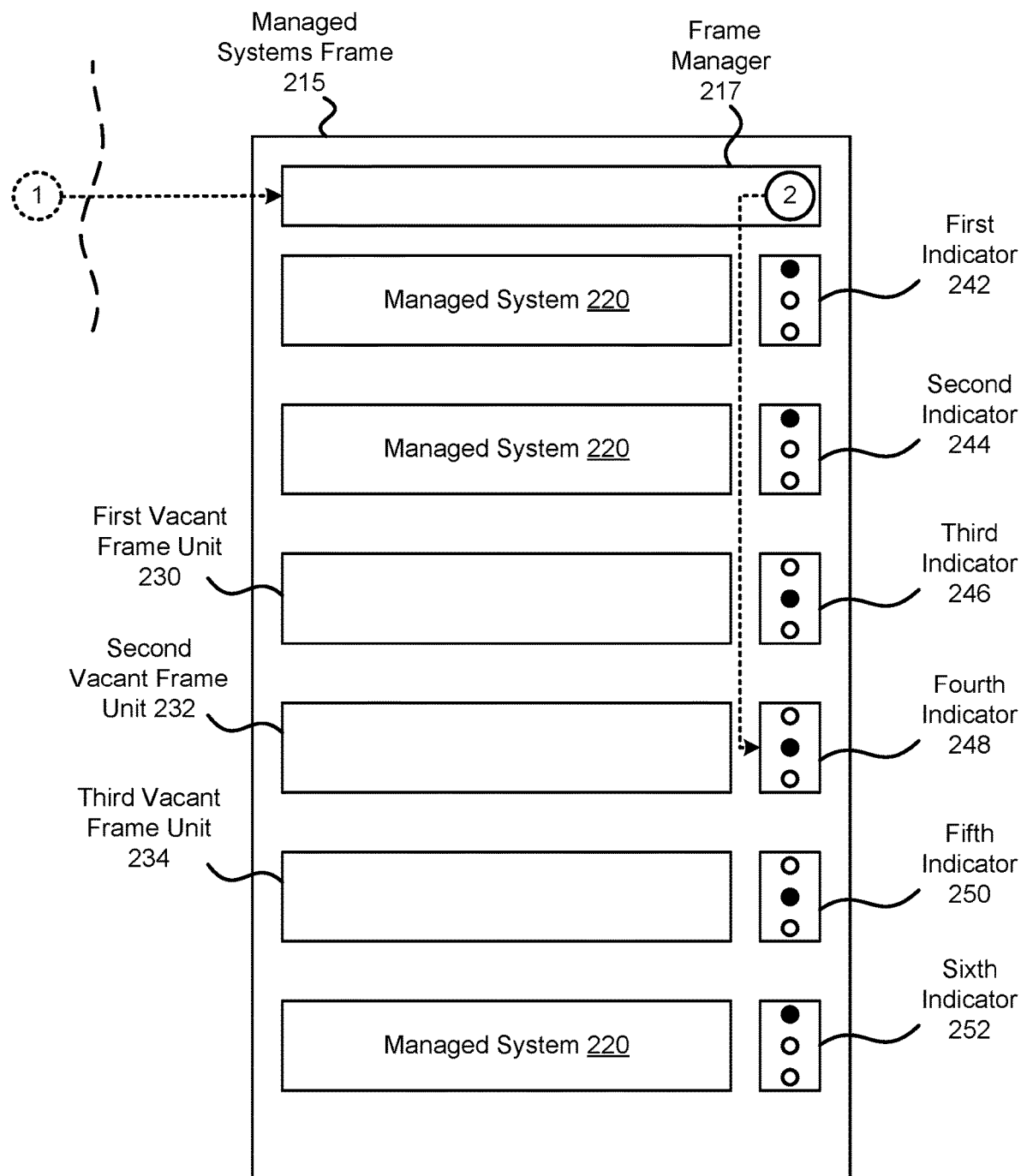
FIGS. 2B-2D show diagrams illustrating interactions between and actions of components of a system in accordance with an embodiment.
Figure 2C:
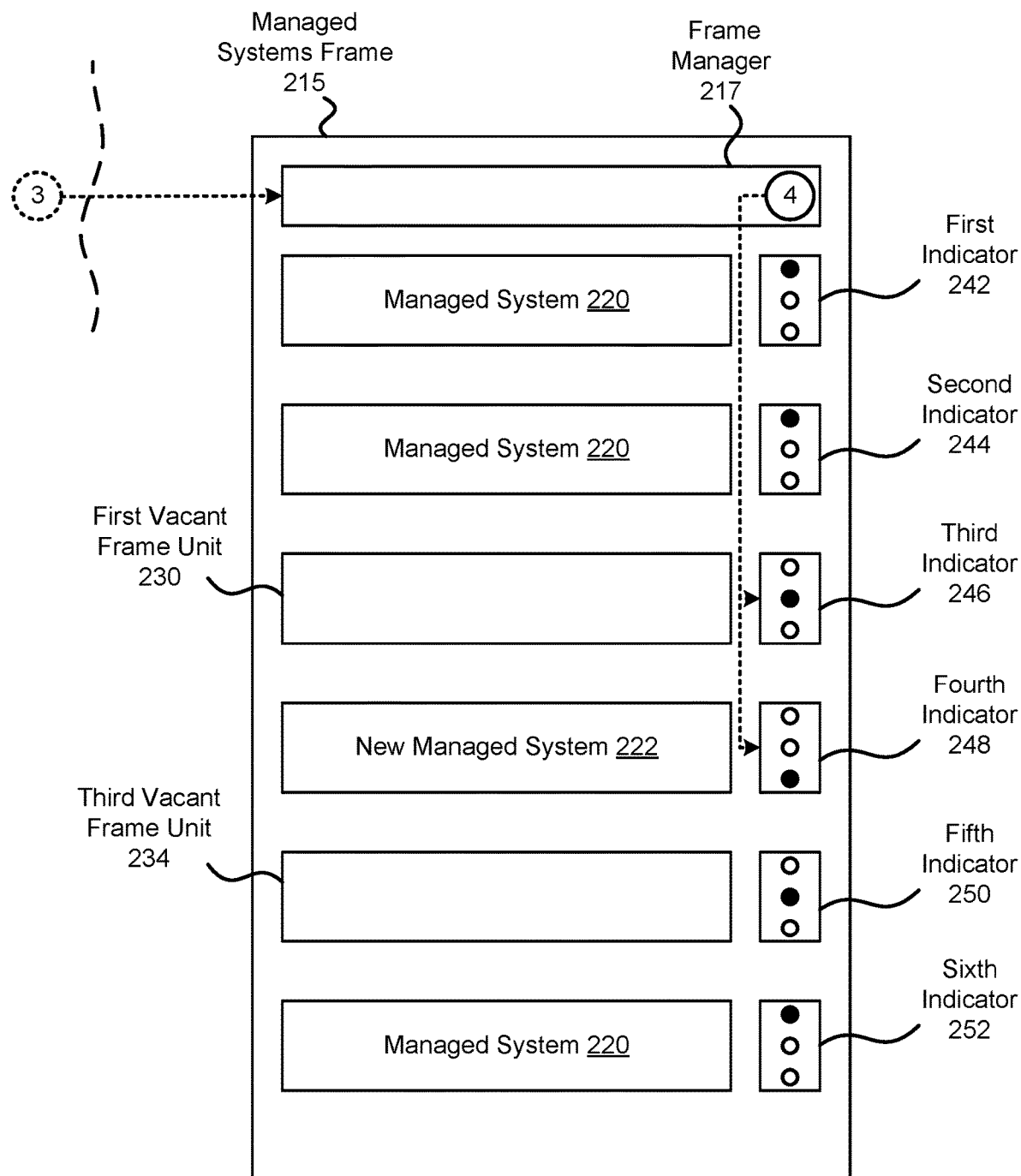
Figure 2D:
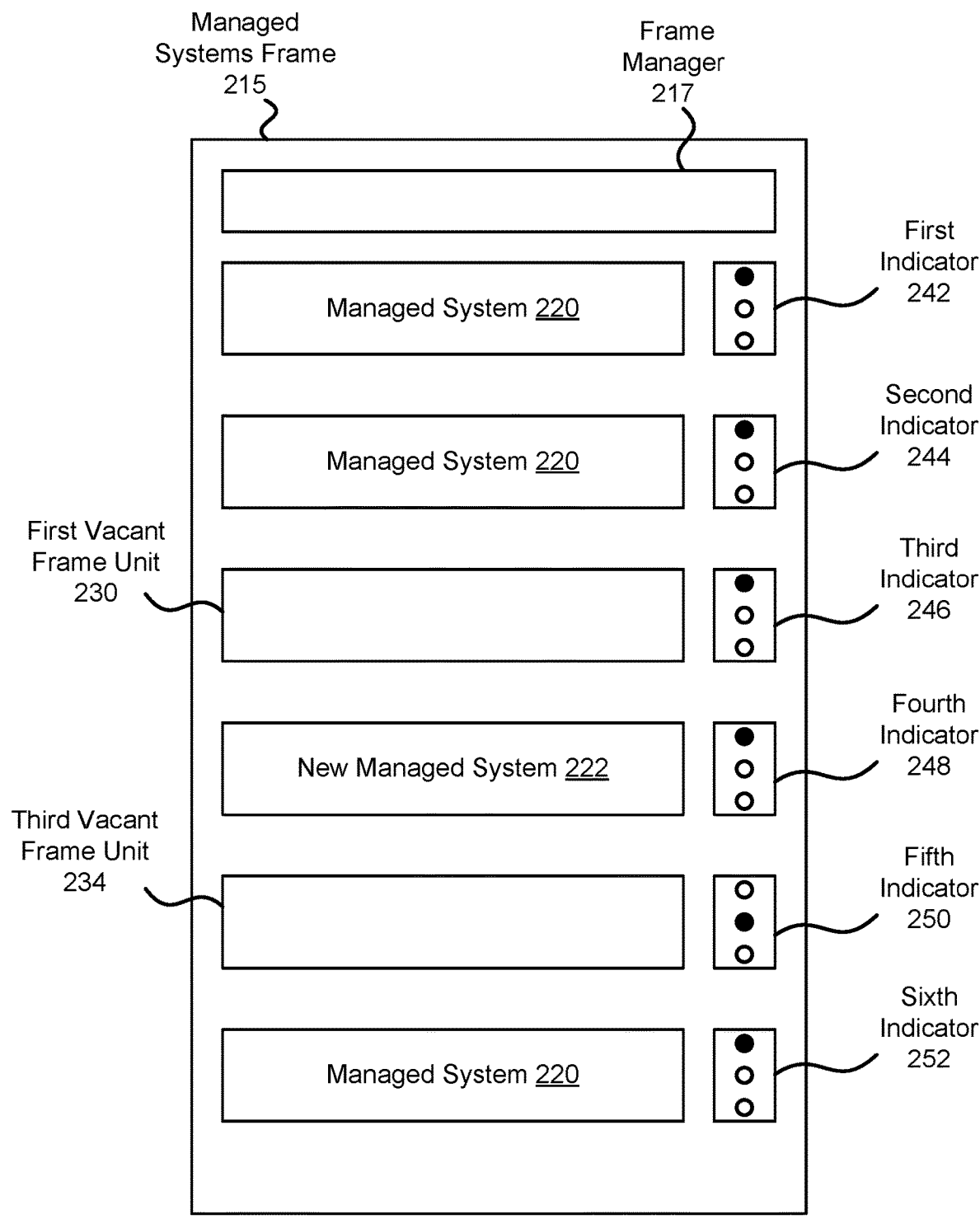

When providing its functionality, managed system manager 170 may perform all, or a portion of the methods of FIGS. 2A, 3A, and 3B and/or the actions illustrated in and/or described with respect to FIGS. 2B-2D, 3B-3E, and 4B-4E.

In an embodiment, managed system manager 170 is implemented using a hardware device including circuitry. The hardware device may be, for example, a digital signal processor, a field programmable gate array, or an application specific integrated circuit. The circuitry may be adapted to cause the hardware device to perform the functionality of managed system manager 170. Managed system manager 170 may be implemented using other types of hardware devices without departing embodiment disclosed herein.

In one embodiment, managed system manager 170 is implemented using a processor adapted to execute computing code stored on a persistent storage that when executed by the processor performs the functionality of managed system manager 170 discussed throughout this application. The processor may be a hardware processor including circuitry such as, for example, a central processing unit, a processing core, or a microcontroller. The processor may be other types of hardware devices for processing information without departing embodiment disclosed herein.

In an embodiment, storage 172 is implemented using physical devices that provide data storage services (e.g., storing data and providing copies of previously stored data). The devices that provide data storage services may include hardware devices and/or logical devices. For example, storage 172 may include any quantity and/or combination of memory devices (i.e., volatile storage), long term storage devices (i.e., persistent storage), other types of hardware devices that may provide short term and/or long term data storage services, and/or logical storage devices (e.g., virtual persistent storage/virtual volatile storage).

For example, storage 172 may include a memory device (e.g., a dual in line memory device) in which data is stored and from which copies of previously stored data are provided. In another example, storage 172 may include a persistent storage device (e.g., a solid-state disk drive) in which data is stored and from which copies of previously stored data is provided. In a still further example, storage 172 may include (i) a memory device (e.g., a dual in line memory device) in which data is stored and from which copies of previously stored data are provided and (ii) a persistent storage device that stores a copy of the data stored in the memory device (e.g., to provide a copy of the data in the event that power loss or other issues with the memory device that may impact its ability to maintain the copy of the data cause the memory device to lose the data).

Storage 172 may also be implemented using logical storage. A logical storage (e.g., virtual disk) may be implemented using one or more physical storage devices whose storage resources (all, or a portion) are allocated for use using a software layer. Thus, a logical storage may include both physical storage devices and an entity executing on a processor or other hardware device that allocates the storage resources of the physical storage devices.

Storage 172 may store data structures including subscription information repository 174, use data repository 176, and managed systems frames maps 178. Each of these data structures is discussed below.

Subscription information repository 174 may be implemented with one or more data structures that store information regarding subscriptions agreed to by various users. For example, subscription information repository 174 may indicate (i) agreed to subscriptions, (ii) agreed to changes in subscriptions upon the occurrence of corresponding conditions (e.g., subscription limits being reached), (iii) limitations on the subscriptions, and/or (iv) other information regarding subscriptions for user of managed systems.

Use data repository 176 may be implemented with one or more data structures that store information regarding use of the services provided by one or more managed systems to users (e.g., that have agreed to various subscriptions for such use). The use data may include quantities of services utilized by a user (e.g., absolute quantities, use rates, and/or other types of information regarding use of such services by subscribed entities), quantities of computing resources consumed by services provided to a user, and/or other information usable to quantify use of managed systems or services provided by the managed systems.

Managed systems frames maps 178 may be implemented with one or more data structures that store information usable to manage managed system frames. For example, managed systems frames map 178 may include information regarding the design (e.g., thermal design) of the managed system frames, locations of various cablings of the frames, information regarding deployed managed systems (e.g., such as sensitivities to the presence of other devices, potential future needs for expansion), lists of frame units and managed systems or other devices deployed therein, and/or other information regarding the current state of the managed system frames.

While various data structures have been illustrated and described in FIG. 1D, any of the data structures may be implemented with any type of structure (e.g., lists, tables, linked lists, databases, etc.), stored in different locations, and/or spanned across any number of devices without departing from embodiments disclosed herein. For example, any of the data structures shown in FIG. 1D may be stored remotely to subscription management service 10 (e.g., in a cloud resource, etc.) in a manner that is still accessible to subscription management service 10.

While illustrated in FIG. 1D with a limited number of specific components, a local subscription manager may include additional, fewer, and/or different components without departing from embodiments disclosed herein.

Turning to FIG. 1E, a front view diagram of an example managed systems frame 180 in accordance with an embodiment is shown. While drawn similar to that of a rack style frame, managed systems frames may utilize other form factors without departing from embodiments disclosed herein.

As noted above, subscription management service 10 may manage managed systems frame 180. To facilitate remote management, managed systems frame 180 may include frame manager 184, any number of locks (e.g., 190), any number of frame unit availability indicators (e.g., 186), and any number of sensors (e.g., 188) that may be associated with corresponding frame units (e.g., 182).

Frame unit 182 may be a portion of managed system frame 180 adapted to receive (e.g., allow deployment of) a managed system or other device. A managed system may be deployed to a frame unit by inserting (partially or entirely) it into the frame unit. Once inserted, various cables and/or other physical structures may be attached to the managed system to supply it with utilities, thermally management it, etc.

However, because various persons may be able to physically access manage systems frame 180, there may be risk of (i) deployed managed systems being removed, (ii) managed systems being deployed to frame units that may negatively impact the operation of the managed system or other devices in managed systems frame 180, (iii) other devices being deployed to a frame unit of managed systems frame 180. To reduce the likelihood of these outcomes from occurring, managed system frame 180 may include frame manager 184.

Frame manager 184 may (i) monitor occupancy of frame units of managed systems frame 180, (ii) provide information regarding the occupancy of the frame units to subscription management service 10, (iii) selectively lock/unlock the frame units based on information obtained from subscription management service 10, and (iv) visually indicate where (e.g., which frame units) managed systems should be deployed based on information obtained from subscription management service 10.

Frame manager 184 may be implemented with a computing device such as a host or server, a personal computer (e.g., desktops, laptops, and tablets), a "thin" client, a personal digital assistant (PDA), a Web enabled appliance, or a mobile phone (e.g., Smartphone), and/or any other type of data processing device or system. For additional details regarding computing devices, refer to FIG. 5.

In an embodiment, sensor 188 includes a proximity sensor. The proximity sensor may be implemented with, for example, a bump sensor, a distance sensor, a hall effect sensor, a capacitance sensor, an infrared radiation sensor, or another type of sensor that may be used to obtain information usable to ascertain whether a corresponding frame unit is occupied. The sensors may be operably connected to frame manager 184, which may aggregate and/or report such information to the subscription management service.

In an embodiment, frame unit availability indicator 186 includes one or more light emitting devices. The light emitting devices may be operably connected to frame manager 184 such that frame manager 184 may be able to use frame unit availability indicator 186 to generate different patterns of light which may be viewed by a person. The light patterns may indicate, to the user, whether a managed system may and/or should be deployed to a corresponding frame unit. For example, the light patterns may include (i) Red which indicates that the corresponding frame unit is occupied and unavailable, (ii) Orange which indicates that the corresponding frame unit is unoccupied and still unavailable due to reasons such are cable routing, air/cooling optimization, etc. which may not be apparent or known or discernable to a person viewing the corresponding frame unit, (iii) Green which indicates that the corresponding frame unit is available for deployment of devices such as managed systems, and/or (iv) Flashing Green which indicates that the corresponding frame unit is to receive a managed system or other device that is to be deployed to the managed system frame. The light patterns may be other types of patterns without departing from embodiments disclosed herein.

In an embodiment, lock 190 includes an actuator and a mechanical element such as a bar, tube, etc. The actuator may be coupled to the mechanical element and allow for the mechanical element to move into and/or out of a corresponding frame unit. Consequently, when the mechanical element is positioned with the corresponding frame unit, managed systems may be locked from being inserted into and/or removed from the corresponding frame unit. When the mechanical element is positioned outside of the frame unit, the managed systems may be inserted into and/or removed from the corresponding frame unit.

In an embodiment, managed system frame 180 includes an open front such that the frame units are always accessible. Doing so may facilitate thermal management via flow of gasses through the open front, but may expose the devices positioned in managed systems frame 180 to persons near managed systems frame 180. However, managed systems frame 180 may mitigate risks associated with the exposure of the managed systems to the persons by, as discussed above, including sensor 188, frame unit availability indicator 186, and/or lock 190.

In addition to the components illustrated in FIG. 1E, managed systems frame unit 180 may include a number of additional components which may be positioned at various location inside of managed systems frame 180. Refer to FIG. 1F for additional details regarding these components that may be inside of managed systems frame 180.

While illustrated in FIG. 1E with a limited number of specific components, a managed systems frame may include additional, fewer, and/or different components without departing from embodiments disclosed herein.

Turning to FIG. 1F, a block diagram illustrating components of managed systems frame 180 in accordance with an embodiment is shown. As seen, managed system frame 180 may include a power distribution unit 191A which may receive power from other entities (e.g., utility grids), condition the power, and provide the power to managed systems and/or other devices in managed systems frame 180 with power cabling 191B. For example, power distribution unit 191A may include a power supply, power bus bars, and/or other structures for facilitating power distribution. Power distribution unit may include a rated power distribution capacity. Consequently, power distribution unit may operate in an undesirable manner if devices that draw too much power are positioned in frame units. These devices may present unexpected loads that may not be serviceable by the power supply. Subscription management service 10 may be aware of power limits associated with power distribution unit 191A and limit deployment of managed systems accordingly.

Power cabling 191B may include any type and quantity of cabling for distributing power. In some scenarios, power cabling 191B may prevent deployment of managed systems to some frame units (e.g., may occupy the same space).

Communication unit 192A may include a top of rack switch or other communication system that may facilitate communications between managed systems positioned in a managed systems rack and other components. The managed systems may be operably connected to communication unit 192A through communication cabling 192B. The presence of communication unit 192A and/or communication cabling 192B may prevent deployment of managed systems to some frame units.

Thermal management unit 193A may include any number of fans, baffles, and/or other structures (e.g., thermal management devices 193B) for removing heat from the interior of a managed system. Thermal management unit 193A may also include, for example, airflow channels and/or void space inside of a managed systems frame usable to airflow management. Any of these structures may prevent deployment of a managed system to some frame units.

While described above as preventing deployment, in some scenarios, deployment of devices to frame units may not be prevented. Rather, the deployment of devices to the corresponding frame units may negatively impact the operation of the managed systems. For example, deployment of a managed system to a frame unit that facilitates airflow may negatively impact the ability of managed systems to be thermally managed (e.g., through reduced airflow). Further, to a person viewing the managed system frame, these issues may not be apparent. Consequently, a person may make a decision regarding where to deploy a managed system or other device to a managed system frame that may negatively impact the deployed managed system or other devices positioned with the managed system frame. In contrast, the subscription management service may actively track and make deployment decisions that take into account these considerations.

While illustrated in FIG. 1F with a limited number of specific components, a managed systems frame 180 may include additional, fewer, and/or different components without departing from embodiments disclosed herein.

As discussed above, managed systems frames may include a range of devices usable to remotely ascertain information regarding occupancy of the managed systems frames and direct future deployment of managed systems. FIGS. 2A, 3A, and 4A illustrate examples of methods that may be performed by the components of FIG. 1A.

Turning to FIG. 2A, a flow diagram illustrating a method of managing the deployment of managed systems to a managed system frame in accordance with an embodiment is shown. The method may be performed, in part or entirely, by a subscription management service (e.g., a subscription manager), a local subscription manager, a frame manager, and/or managed systems.

At operation 200, deployment of a managed system to a managed system frame is initiated. The deployment may be initiated based on a request for new or modified services subscribed to by a user. The managed system may be selected for deployment to service the subscription by the user. The deployment may be initiated by, for example, scheduling delivery and installation of the managed system in the managed system frame. To do so, instructions may be provided to any number of entities that may facilitate delivery of managed systems (e.g., from a facility) to the managed system frame (e.g., located near the user, in a facility specified by the user, etc.).

At operation 202, a frame unit of the managed system frame is selected for the deployed managed system. The frame unit may be selected via any method. For example, the frame unit may be selected based on (i) unoccupied frame units of the manage system frame, (ii) characteristics of deployed managed systems that may make some frame units less desirable for deployment than other frame units, and (iii) characteristics of the managed system frame that may make some frame units less desirable for deployment than other frame units. Other factors may be considered when making the decision without departing from embodiments disclosed herein.

In an embodiment, the selection may be based on information included in managed systems frame maps. For example, the aforementioned data structure may include up to date information regarding the managed system frame and devices deployed there.

At operation 204, availability indicator states for frame units of the managed system frame are selected. The availability indicator state may be selected to indicate to which frame unit the managed system is to be deployed. For example, the availability indicator states associated with occupied frame units may be set to unavailable, the availability indicator states associated with unoccupied but undesirable for occupation frame units may be set to unavailable but unoccupied, the availability indicator states associated with unoccupied and desirable for occupation frame units may be set to ready for occupation and desirable, and the availability indicator state associated with the unoccupied and most desirable frame unit may be set a best candidate state. Different identifiers may be used to distinguish these states without departing from embodiments disclosed herein.

At operation 206, the selected frame unit is indicated to the person tasked with installing the managed system in the managed systems frame using the availability indicator states and availability indicators associated with the frame units. For example, each of the availability indicators may be set to display different light patterns (or other optically recognizable displays of information) corresponding the availability state associated with the corresponding frame unit.

In an embodiment, a display of red is used to indicate unavailability of a frame unit due to occupation, orange is used to indicate unavailability of a frame unit due to undesirability, green is used to indicate availability, and a flashing green is used to indicate the best candidate. Consequently, a person viewing the corresponding availability indicators may be easily able to identify which of the frame units corresponds to the best candidate for deployment of the managed system.

Based on the indicated information, the person may install the managed system in the indicated selected frame unit.

To facilitate use of the availability indicators (also referred to as "indicators"), subscription management service 10 may send corresponding instructions to a frame manager. The frame manager may operate the indicators in accordance with the instructions thereby causing the indicators to display the light patterns, discussed above.

At operation 208, after the managed system is installed in the selected frame unit, selected updated availability indicator states for the frame units may be selected. The availability states may be selected to take into account the newly deployed managed system. For example, the availability state associated with the selected frame unit may be set to occupied and unavailable.

Additionally, at least a second availability indicator may also be updated to reflect that the selected frame unit is occupied and unavailable. For example, deploying the managed system to the selected frame unit may modify airflow patterns inside of the managed system frame thereby decreasing the desirability of deploying other managed system to a second frame unit. In another example, the deployed managed system may be expanded by placing a second managed system proximate to the deployed managed system. Consequently, the second availability indicator for the second frame unit may also be selected to indicate that it is unavailable due to lack of desirability (e.g., due to airflow consideration, future expansion considerations, or for other reasons).

At operation 210, the selected frame unit is indicated to a second person tasked with installing another managed system in the managed system frame that the selected frame unit and at least a second frame unit that is unoccupied by any managed system are both unavailable for the other managed system. The indication may be performed as discussed similarly to that discussed with respect to operation 206 (e.g., operating availability indicators in accordance with the corresponding availability indicator states). However, because multiple availability indicator states have changed, both the selected frame unit and the second frame unit may also be indicated as being unavailable for deployment of the other managed system.

The method may end following operation 210.

To further clarify aspects of the method illustrated in FIG. 2A, an example of operation of a system in accordance with the method is illustrated in FIGS. 2B-2D. In FIGS. 2B-2D, example actions and interactions between a subscription manager (not shown), a managed systems frame 215, a frame manger 217, managed systems (e.g., 220), frame units 230-234, and indicators 242-252. Like named components in FIGS. 2B-2D and FIGS. 1A-1F may be similar. Operations performed by these respective components may be highlighted using numbered, circular blocks. Interactions between these components (e.g., data transmissions, instruction transmissions, etc.) may be illustrated using dashed lines that terminate in arrows.

Turning to FIG. 2B, now consider a scenario where a user of managed systems requests a change in a subscription to a subscription manager. To facilitate the subscription, the managed system may decide that a new managed system may need to be deployed to managed systems frame 215.

Managed systems frame may include availability indicators 242-252 managed by the subscription management service via frame manager 217. In FIG. 2B, indicators 242-252 are illustrated as a set of three light emitting diodes. The top-most light emitting diode indicates that the corresponding frame unit is unavailable when enlightened, the middle light emitting diode indicates that the corresponding frame unit is available when enlightened, and the bottom-most light emitting diode indicates that the managed system should be deployed to the corresponding frame unit.

As seen in FIG. 2B, managed systems frame 215 includes six frame units, three of which being vacant frame units 230-234. Accordingly, three indicators 242, 244, 252 have their top-most light emitting diode enlightened (as indicated by the filled circle, open circles may indicate unlit light emitting diodes). In contrast, third, fourth, and fifth indicators 246, 248, 250 have their middle light emitting diode enlightened to indicate that first, second, and third vacant frame units 230, 232, and 234 are available for deployment of managed systems.

Returning to the discussion of the subscription manager, the subscription manager identifies second vacant frame unit 232 as being the best candidate based on its knowledge of the internal structure of managed systems frame 215. Accordingly, in response, at block 1, the subscription manager generates and sends instructions to frame manager 217 to change the operation of fourth indicator 248 to enlighten its bottom-most light emitting diode and darken its middle light emitting diode. In response, at block 2, frame manager 217 updates the operation of fourth indicator 248 accordingly.

Turning to FIG. 2C, by doing so, the person is easily able to identify the second vacant frame unit and installs new managed system 222 accordingly. Once installed, the subscription manager, at block 3, updates its availability indicator states. Specifically, it updates its availability indicator states corresponding to both the second vacant frame unit and the first vacant frame unit as being unavailable. The availability state for the first vacant frame unit is unavailable because the subscription manager identified that deployment of the managed system to the second vacant frame unit 232 will restrict airflow and deployment of another managed system to the first vacant frame unit 230 may further restrict airflow to the point that thermal management of the managed system may not be able to be met. In response, the subscription manager, at block 3, generates and sends instructions to frame manager 217 to darken the bottom-most light emitting diode of fourth indicator 248, enlighten the top-most indicator of fourth indicator 248, darken the middle light emitting diode of third indicator 246, and enlighten the top-most indicator of third indicator 246. In response, frame manager 217 updates the operation of fourth indicator 248 accordingly.

Turning to FIG. 2D, by doing so, the light provided by third indicator 246 and fourth indicator 248 may be updated to indicate that neither of the corresponding frame units are available for deployment of managed systems, even though not all of the frame units are occupied.

As illustrated in FIGS. 2A-2D, embodiments disclosed herein may facilitate guided deployment of managed systems to managed system frames. Thus, embodiments disclosed herein may address the technical challenge of lack of information regarding how different deployment decisions may impact the operation of the managed system frame and devices deployed there. The disclosed systems and method may address this problem by guiding a person during the installation process in a manner that takes into account of range of different factors that may be unknown to the person performing the deployment. Consequently, the resulting system may be more likely to provide desired computer implemented services.

Turning to FIG. 3A, a flow diagram illustrating a method of managing the deployment of managed systems to a managed system frame based on frame unit occupancy in accordance with an embodiment is shown. The method may be performed, in part or entirely, by a subscription management service (e.g., a subscription manager), a local subscription manager, a frame manager, and/or managed systems.

At operation 300, frame-unit level occupancy data for a managed system frame is monitored using sensors associated with frame units of the managed system frame. The frame-unit level occupancy data may be monitored by using sensor data to identify changes in occupancy of frame units of the managed system frame. The sensors may be read by a frame manager of the managed system frame. The managed system frame may report the read sensor data to the subscription manager. The subscription manager may update its records regarding the occupancy of the frame units of the managed system frame based on the identified changes in occupancy.

The sensors may be any type of sensor that may detect the presence of an enclosure in a frame unit of the managed systems frame. For example, the sensors may include bump sensor, distance sensors, etc.

At operation 302, a comparison between the frame-unit level occupancy of the managed system frame and the expected occupancy for the managed system frame is made. The comparison may be made by comparing the frame-unit level occupancy data to subscriptions implemented with the managed system and/or a map of the managed system frame maintained by the subscription manager. For example, the subscription manager may update the occupancy of each of the frame units of the managed system frame as managed systems are deployed. The comparison may be a frame unit by frame unit comparison to identify whether any unexpected enclosures are present.

At operation 304, a determination is made regarding whether the comparison indicates an unexpected occupancy of one or more of the frame units of the managed systems frame. If the comparison indicates that any of the frame units are occupied but are not expected to be occupied, then it may be determined that an unexpected occupancy is indicated by the comparison.

If the comparison indicates an unexpected occupancy, then the method may proceed to operation 306. Otherwise the method may proceed to operation 310 following operation 304.

At operation 306, the unexpected occupancy is remediated. Remediating the unexpected occupancy may allow for deployment of managed systems in a manner consistent with the occupancy of the managed systems frame.

In an embodiment, the unexpected occupancy is remediated by initiating removal an enclosure from the one of the frame units; and detecting the removal of the enclosure from the one of the frame units using the sensors.

The remediation of the frame unit may also include initiating deployment of the enclosure to another of the frame units; and detecting presence of the enclosure in the other frame unit of the frame units. In other words, the enclosure may be removed or moved to another frame unit. The unit may be moved to another frame unit after confirming with a user that the enclosure is authorized to be deployed in the managed system frame. Otherwise, the enclosure may be removed without being deployed to a different frame unit.

At operation 308, the frame-unit level occupancy is updated based on the remediated unexpected occupancy to obtain updated frame-unit level occupancy for the managed system frame. The updated frame-unit level occupancy may be obtained by performing monitoring, as discussed with respect to operation 300. For example, the sensors corresponding to each of the frame units may be read to ascertain the occupancy of each of the frame units. The results of the readings may be aggregated as the updated frame-unit level occupancy of the managed system frame.

At operation 310, at least one managed system is deployed to the managed system frame based on the updated frame-unit level occupancy of the managed system frame. The at least one managed system may be deployed by selecting a frame unit based on the updated frame-unit level occupancy for the managed system frame. The at least one managed system may then be deployed to the selected frame unit.

After deployment, the newly deployed at least one managed system may be used to provide desired computer implemented services to one or more users of managed systems deployed in the managed systems frame.

The method may end following operation 310.

To further clarify aspects of the method illustrated in FIG. 3A, an example of operation of a system in accordance with the method is illustrated in FIGS. 3B-3E. In FIGS. 3B-3E, example actions and interactions between a subscription manager (not shown), a managed systems frame 320, a frame manger 322, managed systems (e.g., 350), frame units 340-345, and sensors 330-335. Like named components in FIGS. 3B-3E and FIGS. 1A-1F may be similar. Operations performed by these respective components may be highlighted using numbered, circular blocks. Interactions between these components (e.g., data transmissions, instruction transmissions, etc.) may be illustrated using dashed lines that terminate in arrows.

Turning to FIG. 3B, now consider a scenario subscription manager is tasked with managing deployment of managed systems to managed systems frame 320. To facilitate the management, the subscription manager may check the occupancy of managed systems frame 320 prior to deploying managed systems.

To provide such information, managed systems frame 320 may include sensors 330-335 able to measure whether an enclosure is present in any of the corresponding frame units 340-345. In FIG. 3B, sensors 330-335 are illustrated as solid filled with black or unfilled rectangles. A rectangle filled with black (e.g., 330, 331, 333) indicates that the sensor detects the presence of an enclosure while a rectangle that is unfilled (e.g., 332, 334, 335) indicates that the sensor does not detect an enclosure.

To provide the subscription manager with frame-unit level occupancy data, frame manager 322, at block 1, reads the sensors and reports the readings to the subscription manager. Based on the readings, the subscription manager ascertains that third, fifth, and sixth frame unit 342, 344, 345 are unoccupied.

Turning to FIG. 3D, at a later point in time, a person deploys an unknown device 356 to third frame 342. In response, at block 2, third sensor 332 detects the presence of unknown device 356 to fame manager 322. Frame manager 322, at block 3, notifies the subscription manager of the presence of an enclosure in third frame unit 342.

The subscription manager identifies, using the provided information that the presence of unknown device 356 is unexpected. As discussed above, presence of unknown or planned for devices in managed systems frame 320 may be problematic from a power, thermal, and/or communications perspective. Consequently, the subscription manager notifies the users of managed systems frame 320 of the presence. One of the users acknowledges the device as being authorized. Consequently, the subscription manager merely schedules redeploying the unknown device from third frame unit 342 to fifth frame unit 344.

Turning to FIG. 3D, after the unknown device 356 is redeployed, third sensor 332 and fifth sensor 334, at blocks 4 and 5, report that they are now unoccupied and occupied, respectively, to frame manager 322. In response, frame manager, at block 6, notifies the subscription manager of the updated frame-unit level occupancy.

Consequently, when a subscription change implicating deployment of a new managed system to managed systems frame 320, third frame unit 342 is selected for the deployment.

Turning to FIG. 3E, after new managed system 358 is deployed to third frame unit 342, third sensor, at block 7, identifies that it is occupied and notifies frame manager 322. In turn, frame manager 322 notifies the subscription manager so that no attempts to deploy managed systems to third frame unit 342 are made.

As illustrated in FIGS. 3A-3E, embodiments disclosed herein may facilitate active management of frame units of managed system frames. Thus, embodiments disclosed herein may address the technical challenge of lack of information regarding how different deployment decisions may impact the operation of the managed system frame and devices deployed there. The disclosed systems and method may address this problem by proactively and remotely identifying deployments of managed systems. Consequently, the resulting system may be more likely to provide desired computer implemented services by proactively remediating deployed systems that may negative impact the operation of the managed system frame and/or devices deployed therein.

Turning to FIG. 4A, a flow diagram illustrating a method of managing security of a managed system frame in accordance with an embodiment is shown. The method may be performed, in part or entirely, by a subscription management service (e.g., a subscription manager), a local subscription manager, a frame manager, and/or managed systems.

At operation 400, a subscription modification for a user is obtained. The subscription modification may be obtained via a graphical use interface presented to the user. The subscription modification may require deployment of a managed system to a managed system frame.

At operation 402, a managed system is selected to service the subscription modification. The managed system may be selected, for example, based on the services subscribed to via the subscription modification. The services may be used to identify computing resources that may be necessary to service the modified subscription. The managed system may be selected on the basis of the computing resources (e.g., so that it includes at least the quantity necessary to service the modified subscription), or a portion thereof (e.g., if multiple managed system may be selected and deployed to service the modified subscription).

At operation 404, a frame unit of a managed system frame is selected for the managed system. The frame unit may be selected using any method and may take into account, for example, characteristics of the managed system frame, the managed systems already deployed, future expansion considerations, etc.

At operation 406, while the managed system is being deployed in the managed system frame, the selected frame unit may be unlocked. The selected frame unit may be unlocked by sending instructions to a frame manager of the managed system frame. The frame manager may operate a lock corresponding to the selected frame unit to unlock it. Unlocking the selected frame unit may allow enclosure to be removed from and/or deployed to the frame unit.

Prior to operation 406, the selected frame unit may be locked thereby preventing changes in the occupancy of the selected frame unit. Consequently, attempts to deploy enclosures to it may be proactively thwarted.

At operation 408, after the managed systems is deployed, the selected frame unit is locked to secure the managed system. The selected frame unit may be locked as discussed with respect to unlocking the selected frame unit.

Once deployed to the selected frame unit, operation of the managed system deployed in the selected frame unit may be updated to provide desired computer implemented services to the user. The operation may be updated by sending subscription updates to the local subscription manager hosted by the managed system.

The method may end following operation 308.

To further clarify aspects of the method illustrated in FIG. 4A, an example of operation of a system in accordance with the method is illustrated in FIGS. 4B-4E. In FIGS. 4B-4E, example actions and interactions between a subscription manager (not shown), a managed systems frame 420, a frame manger 422, managed systems 450-454, frame units 440-345, and locks 430-435. Like named components in FIGS. 4B-4E and FIGS. 1A-1F may be similar. Operations performed by these respective components may be highlighted using numbered, circular blocks. Interactions between these components (e.g., data transmissions, instruction transmissions, etc.) may be illustrated using dashed lines that terminate in arrows.

Turning to FIG. 3B, now consider a scenario subscription manager is tasked with managing deployment of managed systems to managed systems frame 420. To prevent any managed systems from being removed from or deployed to managed systems frame 420 without agreement by the subscription manager, locks 430-435 may be locked (shown as rectangular blocks that are solid filled to indicate locked state and unfilled to indicate unlocked state in FIGS. 4B-4E).

However, a user of managed systems 450-454 elects a subscription modification that cannot be satisfied by the already deployed managed systems. Consequently, the subscription manager initiates deployment of a managed system to managed systems frame 420 may schedule its transportation to and installation in managed systems frame 420.

Once scheduled, the subscription manager selects third frame unit 442 for the managed system based on the characteristics of the unoccupied frame units. Based on the selection, at block 1, managed systems frame 420 sends instructions to frame manager 422 to unlock third lock 432. In response, at block 2, frame manager 422 operations third lock 432 to transition it from the locked to unlocked state.

Figure 4C:
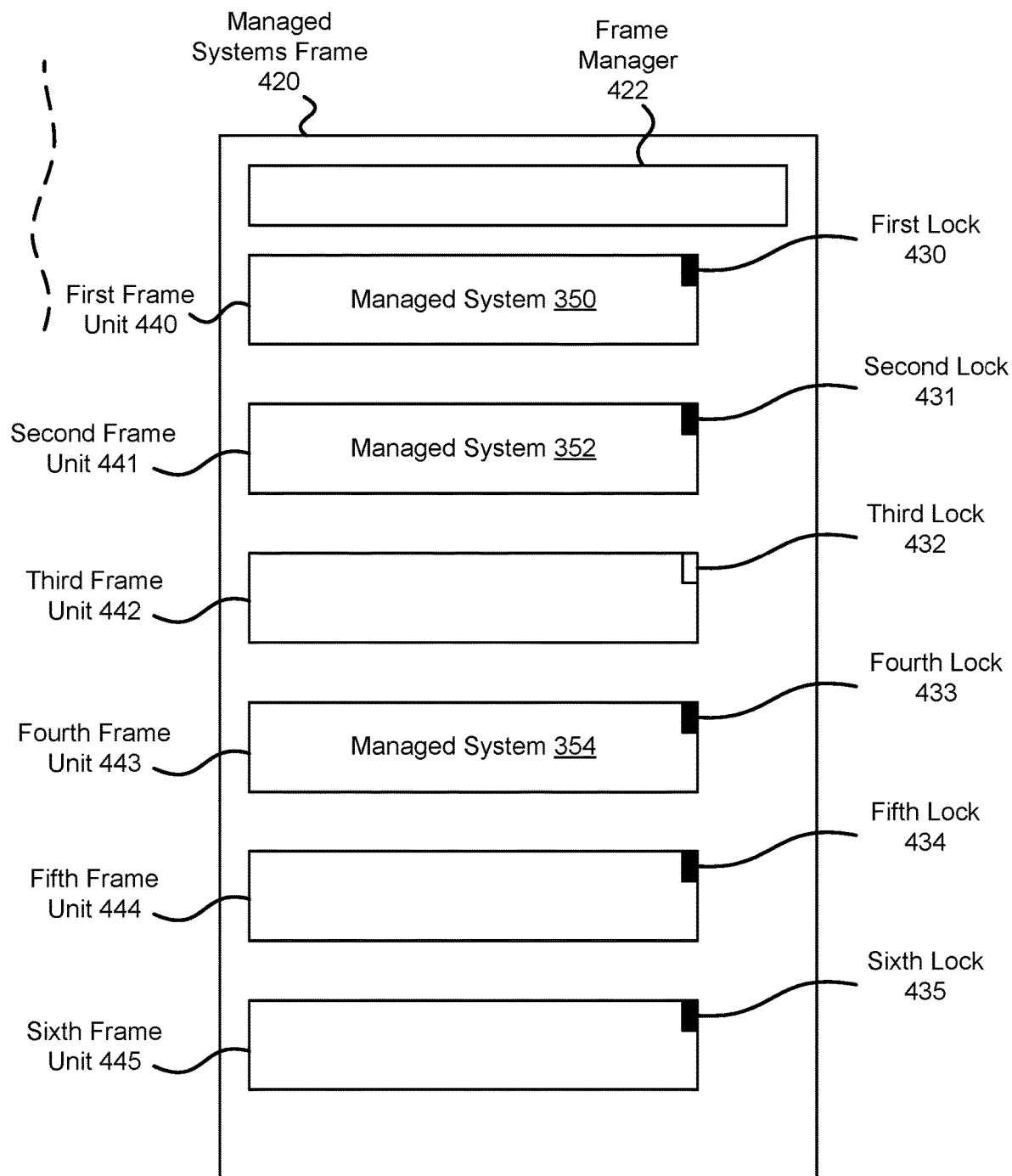
Figure 4D:
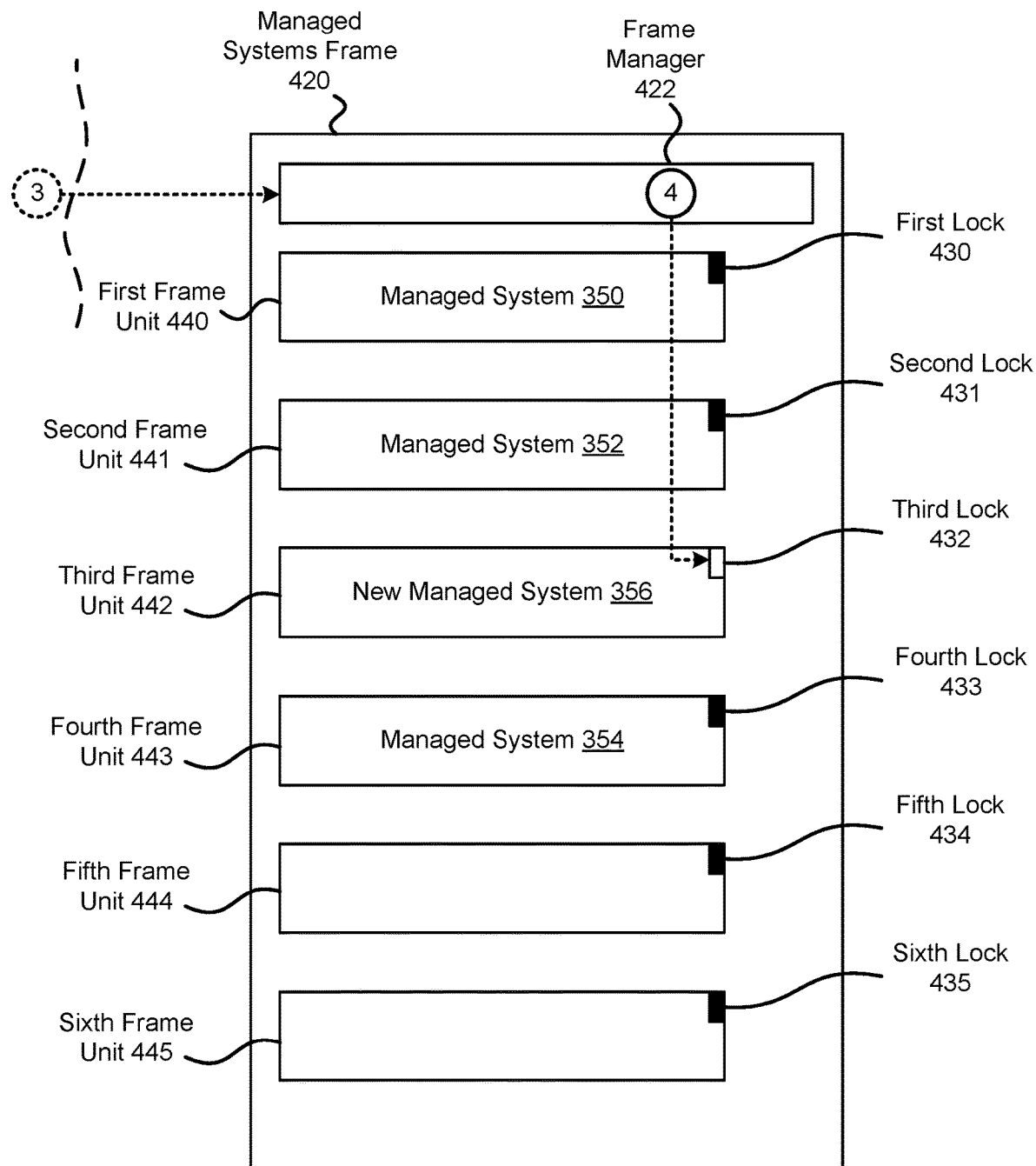

Turning to FIG. 4C, operating third lock 432 unlocks (as indicated by the unfilled box) third frame unit 442 for deployment of managed systems. Turning to FIG. 4D, once new managed system 356 is deployed to third frame unit 442, subscription manager, at block 3, instructs frame manager 422 to lock third lock 432.

In response, at block 4, frame manager 422 operation third lock 432 to change it from the unlocked state to the locked state.

Figure 4E:
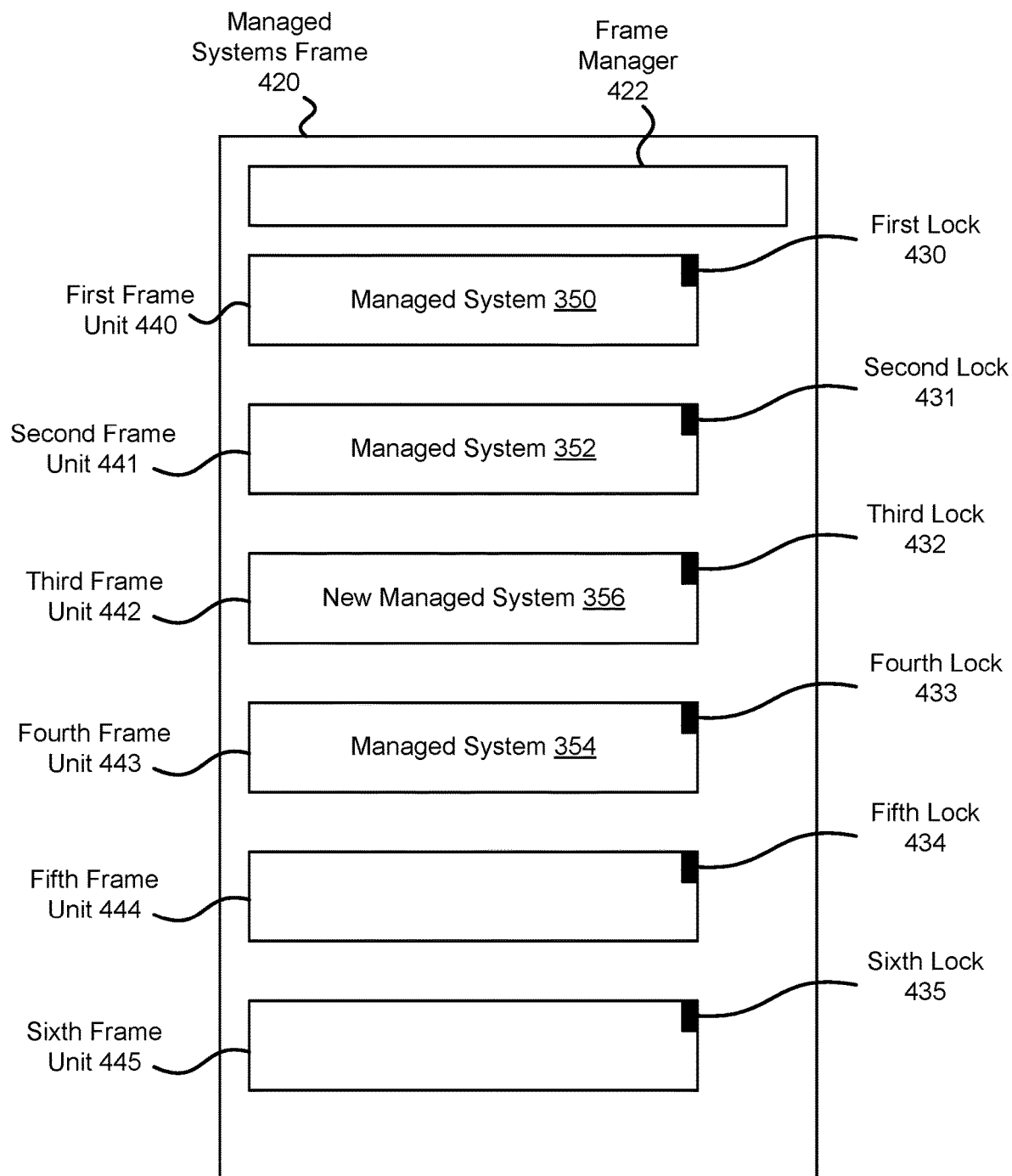

Consequently, turning to FIG. 4E, third lock 432 is locked thereby preventing new managed system 356 from being removed.

As illustrated in FIGS. 4A-4E, embodiments disclosed herein may facilitate active management of frame units of managed system frames. Thus, embodiments disclosed herein may address the technical challenge of lack of information regarding the devices actually deployed to a managed system rack. The disclosed systems and method may address this problem by only allowing removal and deployment of managed systems during particular periods of time and only for some frame units. Consequently, devices that are not deployed by a subscription manager may not be able to be added to managed system racks. Accordingly, deployment conflicts (e.g., frame units believed to be unoccupied but actually are occupied) may be avoided.

Thus, as seen in FIGS. 4A-4E, managed systems may be managed in a distributed system in a manner that increases that likelihood of desired computer implemented services being provided to users over time.

By providing methods and systems, as discussed above, an improved computing system may be provided that may be more resilient to attempts to contravene or otherwise interfere with the computer implemented services provided by a distributed system as part of a solution. Any of the managed systems may be subject to compromise due to malware and/or other types of entities. In distributed systems, malware may be particularly problematic because it may prevent management of systems if the control layer on the managed systems is compromised. Embodiments disclosed herein may provide a distributed control layer that does not include the managed systems themselves. Rather, embodiments disclosed herein may utilize local subscription managers for providing control plane functionality for managed systems. Unlike the managed systems that may be highly reconfigurable to provide various solutions (which may make them more susceptible to compromise by virtue of their configurability), the local subscription managers may be implemented as hardened or locked down entities.

Further, the local subscription managers may present network end points and/or otherwise publicly identify as devices separate from host managed systems. Consequently, the control layer used to manage the configuration of the distributed system may be far more resilient to malicious attacks.

Accordingly, embodiments disclosed herein may be provide for the improved operation of distributed system by improving reliance to malware or other types of third party attacks while still providing for configurability over time such that various types of desired solutions may be provided over time.

As discussed above, various components may be implemented with computing devices. For example, any of the components illustrated in FIGS. 1-4 may be implemented with one or more computing devices. Turning to FIG. 5, a block diagram illustrating an example of a data processing system (e.g., a computing device) in accordance with an embodiment is shown. For example, system 500 may represent any of data processing systems described above performing any of the processes or methods described above. System 500 can include many different components. These components can be implemented as integrated circuits (ICs), portions thereof, discrete electronic devices, or other modules adapted to a circuit board such as a motherboard or add-in card of the computer system, or as components otherwise incorporated within a chassis of the computer system. Note also that system 500 is intended to show a high level view of many components of the computer system. However, it is to be understood that additional components may be present in certain implementations and furthermore, different arrangement of the components shown may occur in other implementations. System 500 may represent a desktop, a laptop, a tablet, a server, a mobile phone, a media player, a personal digital assistant (PDA), a personal communicator, a gaming device, a network router or hub, a wireless access point (AP) or repeater, a set-top box, or a combination thereof. Further, while only a single machine or system is illustrated, the term "machine" or "system" shall also be taken to include any collection of machines or systems that individually or jointly execute a set (or multiple sets) of instructions to perform any one or more of the methodologies discussed herein.

In one embodiment, system 500 includes processor 501, memory 503, and devices 505-508 via a bus or an interconnect 510. Processor 501 may represent a single processor or multiple processors with a single processor core or multiple processor cores included therein. Processor 501 may represent one or more general-purpose processors such as a microprocessor, a central processing unit (CPU), or the like. More particularly, processor 501 may be a complex instruction set computing (CISC) microprocessor, reduced instruction set computing (RISC) microprocessor, very long instruction word (VLIW) microprocessor, or processor implementing other instruction sets, or processors implementing a combination of instruction sets. Processor 501 may also be one or more special-purpose processors such as an application specific integrated circuit (ASIC), a cellular or baseband processor, a field programmable gate array (FPGA), a digital signal processor (DSP), a network processor, a graphics processor, a network processor, a communications processor, a cryptographic processor, a co-processor, an embedded processor, or any other type of logic capable of processing instructions.

Processor 501, which may be a low power multi-core processor socket such as an ultra-low voltage processor, may act as a main processing unit and central hub for communication with the various components of the system. Such processor can be implemented as a system on chip (SoC). Processor 501 is configured to execute instructions for performing the operations discussed herein. System 500 may further include a graphics interface that communicates with optional graphics subsystem 504, which may include a display controller, a graphics processor, and/or a display device.

Processor 501 may communicate with memory 503, which in one embodiment can be implemented via multiple memory devices to provide for a given amount of system memory. Memory 503 may include one or more volatile storage (or memory) devices such as random access memory (RAM), dynamic RAM (DRAM), synchronous DRAM (SDRAM), static RAM (SRAM), or other types of storage devices. Memory 503 may store information including sequences of instructions that are executed by processor 501, or any other device. For example, executable code and/or data of a variety of operating systems, device drivers, firmware (e.g., input output basic system or BIOS), and/or applications can be loaded in memory 503 and executed by processor 501. An operating system can be any kind of operating systems, such as, for example, Windows® operating system from Microsoft °, Mac OS®/iOS® from Apple, Android® from Google®, Linux®, Unix®, or other real-time or embedded operating systems such as VxWorks.

System 500 may further include IO devices such as devices (e.g., 505, 506, 507, 508) including network interface device(s) 505, optional input device(s) 506, and other optional IO device(s) 507. Network interface device(s) 505 may include a wireless transceiver and/or a network interface card (NIC). The wireless transceiver may be a WiFi transceiver, an infrared transceiver, a Bluetooth transceiver, a WiMax transceiver, a wireless cellular telephony transceiver, a satellite transceiver (e.g., a global positioning system (GPS) transceiver), or other radio frequency (RF) transceivers, or a combination thereof. The NIC may be an Ethernet card.

Input device(s) 506 may include a mouse, a touch pad, a touch sensitive screen (which may be integrated with a display device of optional graphics subsystem 504), a pointer device such as a stylus, and/or a keyboard (e.g., physical keyboard or a virtual keyboard displayed as part of a touch sensitive screen). For example, input device(s) 506 may include a touch screen controller coupled to a touch screen. The touch screen and touch screen controller can, for example, detect contact and movement or break thereof using any of a plurality of touch sensitivity technologies, including but not limited to capacitive, resistive, infrared, and surface acoustic wave technologies, as well as other proximity sensor arrays or other elements for determining one or more points of contact with the touch screen.

IO devices 507 may include an audio device. An audio device may include a speaker and/or a microphone to facilitate voice-enabled functions, such as voice recognition, voice replication, digital recording, and/or telephony functions. Other IO devices 507 may further include universal serial bus (USB) port(s), parallel port(s), serial port(s), a printer, a network interface, a bus bridge (e.g., a PCI-PCI bridge), sensor(s) (e.g., a motion sensor such as an accelerometer, gyroscope, a magnetometer, a light sensor, compass, a proximity sensor, etc.), or a combination thereof. IO device(s) 507 may further include an imaging processing subsystem (e.g., a camera), which may include an optical sensor, such as a charged coupled device (CCD) or a complementary metal-oxide semiconductor (CMOS) optical sensor, utilized to facilitate camera functions, such as recording photographs and video clips. Certain sensors may be coupled to interconnect 510 via a sensor hub (not shown), while other devices such as a keyboard or thermal sensor may be controlled by an embedded controller (not shown), dependent upon the specific configuration or design of system 500.

To provide for persistent storage of information such as data, applications, one or more operating systems and so forth, a mass storage (not shown) may also couple to processor 501. In various embodiments, to enable a thinner and lighter system design as well as to improve system responsiveness, this mass storage may be implemented via a solid state device (SSD). However, in other embodiments, the mass storage may primarily be implemented using a hard disk drive (HDD) with a smaller amount of SSD storage to act as a SSD cache to enable non-volatile storage of context state and other such information during power down events so that a fast power up can occur on re-initiation of system activities. Also a flash device may be coupled to processor 501, e.g., via a serial peripheral interface (SPI). This flash device may provide for non-volatile storage of system software, including a basic input/output software (BIOS) as well as other firmware of the system.

Storage device 508 may include computer-readable storage medium 509 (also known as a machine-readable storage medium or a computer-readable medium) on which is stored one or more sets of instructions or software (e.g., processing module, unit, and/or processing module/unit/logic 528) embodying any one or more of the methodologies or functions described herein. Processing module/unit/logic 528 may represent any of the components described above. Processing module/unit/logic 528 may also reside, completely or at least partially, within memory 503 and/or within processor 501 during execution thereof by system 500, memory 503 and processor 501 also constituting machine-accessible storage media. Processing module/unit/logic 528 may further be transmitted or received over a network via network interface device(s) 505.

Computer-readable storage medium 509 may also be used to store some software functionalities described above persistently. While computer-readable storage medium 509 is shown in an exemplary embodiment to be a single medium, the term "computer-readable storage medium" should be taken to include a single medium or multiple media (e.g., a centralized or distributed database, and/or associated caches and servers) that store the one or more sets of instructions. The terms "computer-readable storage medium" shall also be taken to include any medium that is capable of storing or encoding a set of instructions for execution by the machine and that cause the machine to perform any one or more of the methodologies disclosed herein. The term "computer-readable storage medium" shall accordingly be taken to include, but not be limited to, solid-state memories, and optical and magnetic media, or any other non-transitory machine-readable medium.

Processing module/unit/logic 528, components and other features described herein can be implemented as discrete hardware components or integrated in the functionality of hardware components such as ASICS, FPGAs, DSPs or similar devices. In addition, processing module/unit/logic 528 can be implemented as firmware or functional circuitry within hardware devices. Further, processing module/unit/logic 528 can be implemented in any combination hardware devices and software components.

Note that while system 500 is illustrated with various components of a data processing system, it is not intended to represent any particular architecture or manner of interconnecting the components; as such details are not germane to embodiments disclosed herein. It will also be appreciated that network computers, handheld computers, mobile phones, servers, and/or other data processing systems which have fewer components or perhaps more components may also be used with embodiments disclosed herein.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities.

It should be borne in mind, however, that all of these and similar terms are to be associated with the appropriate physical quantities and are merely convenient labels applied to these quantities. Unless specifically stated otherwise as apparent from the above discussion, it is appreciated that throughout the description, discussions utilizing terms such as those set forth in the claims below, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments disclosed herein also relate to an apparatus for performing the operations herein. Such a computer program is stored in a non-transitory computer readable medium. A non-transitory machine-readable medium includes any mechanism for storing information in a form readable by a machine (e.g., a computer). For example, a machine-readable (e.g., computer-readable) medium includes a machine (e.g., a computer) readable storage medium (e.g., read only memory ("ROM"), random access memory ("RAM"), magnetic disk storage media, optical storage media, flash memory devices).

The processes or methods depicted in the preceding figures may be performed by processing logic that comprises hardware (e.g. circuitry, dedicated logic, etc.), software (e.g., embodied on a non-transitory computer readable medium), or a combination of both. Although the processes or methods are described above in terms of some sequential operations, it should be appreciated that some of the operations described may be performed in a different order. Moreover, some operations may be performed in parallel rather than sequentially.

Embodiments disclosed herein are not described with reference to any particular programming language. It will be appreciated that a variety of programming languages may be used to implement the teachings of embodiments disclosed herein as described herein.

In the foregoing specification, embodiments have been described with reference to specific exemplary embodiments thereof. It will be evident that various modifications may be made thereto without departing from the broader spirit and scope disclosed herein as set forth in the following claims. The specification and drawings are, accordingly, to be regarded in an illustrative sense rather than a restrictive sense.

What is claimed is:

1. A computer-implemented method for managing a distributed system comprising managed systems and a subscription manager that manages operation of the managed systems, the method comprising:
    monitoring, by the subscription manager, frame-unit level occupancy of a managed system frame using sensors associated with frame units of the managed system frame;
    making, by the subscription manager, a comparison between the frame-unit level occupancy of the managed system frame to expected occupancy for the managed system frame;
    making, by the subscription manager, a determination that the comparison indicates an unexpected occupancy in one of the frame units;
    in response to the determination:
        remediating, by the subscription manager, the unexpected occupancy in the one of the frame units;
        updating, by the subscription manager, the frame-unit level occupancy based on the remediated unexpected occupancy in the one of the frame units to obtain updated frame-unit level occupancy for the managed system; and
        deploying, by the subscription manager, at least one of the managed systems to the managed system frame based on the updated frame-unit level occupancy of the managed system.

2. The computer-implemented method of claim 1, further comprising:
    providing, by the subscription manager, subscribed to computer implemented services to a user using the deployed at least one of the managed systems.

3. The computer-implemented method of claim 1, wherein at least one of the sensors comprises a proximity sensor, the proximity sensor being positioned to detect when any of the managed systems are present in a corresponding frame unit of the frame units.

4. The computer-implemented method of claim 3, wherein the proximity sensor is a sensor selected from a group of sensors consisting of a bump sensor, a distance sensor, a capacitance senor, a hall effect sensor, and an infrared radiation sensor.

5. The computer-implemented method of claim 1, wherein remediating the unexpected occupancy comprises:
  initiating removal an enclosure from the one of the frame units; and
  detecting the removal of the enclosure from the one of the frame units using the sensors.

6. The computer-implemented method of claim 5, wherein remediating the unexpected occupancy further comprises:
  initiating deployment of the enclosure to another of the frame units; and
  detecting presence of the enclosure in the other frame unit of the frame units.

7. The computer-implemented method of claim 6, wherein updating the frame-unit level occupancy comprises:
  marking the other frame unit of the frame units as being occupied.

8. The computer-implemented method of claim 7, wherein remediating the unexpected occupancy further comprises:
  prior to initiating the deployment of the enclosure to the other frame unit of the frame units, confirming, with a user subscribed to use the managed system frame, that the enclosure is authorized to be deployed in the managed system frame.

9. A non-transitory machine-readable medium having instructions stored therein, which when executed by a processor, cause the processor to perform operations for managing a distributed system comprising managed systems and a subscription manager that manages operation of the managed systems, the operations comprising:
  monitoring, by the subscription manager, frame-unit level occupancy of a managed system frame using sensors associated with frame units of the managed system frame;
  making, by the subscription manager, a comparison between the frame-unit level occupancy of the managed system frame to expected occupancy for the managed system frame;
  making, by the subscription manager, a determination that the comparison indicates an unexpected occupancy in one of the frame units;
  in response to the determination:
    remediating, by the subscription manager, the unexpected occupancy in the one of the frame units;
    updating, by the subscription manager, the frame-unit level occupancy based on the remediated unexpected occupancy in the one of the frame units to obtain updated frame-unit level occupancy for the managed system; and
    deploying, by the subscription manager, at least one of the managed systems to the managed system frame based on the updated frame-unit level occupancy of the managed system.

10. The non-transitory machine-readable medium of claim 9, wherein the operations further comprise:
  providing, by the subscription manager, subscribed to computer implemented services to a user using the deployed at least one of the managed systems.

11. The non-transitory machine-readable medium of claim 9, wherein at least one of the sensors comprises a proximity sensor, the proximity sensor being positioned to detect when any of the managed systems are present in a corresponding frame unit of the frame units.

12. The non-transitory machine-readable medium of claim 11, wherein the proximity sensor is a sensor selected from a group of sensors consisting of a bump sensor, a distance sensor, a capacitance senor, a hall effect sensor, and an infrared radiation sensor.

13. The non-transitory machine-readable medium of claim 9, wherein remediating the unexpected occupancy comprises:
  initiating removal an enclosure from the one of the frame units; and
  detecting the removal of the enclosure from the one of the frame units using the sensors.

14. The non-transitory machine-readable medium of claim 13, wherein remediating the unexpected occupancy further comprises:
  initiating deployment of the enclosure to another of the frame units; and
  detecting presence of the enclosure in the other frame unit of the frame units.

15. The non-transitory machine-readable medium of claim 14, wherein updating the frame-unit level occupancy comprises:
  marking the other frame unit of the frame units as being occupied.

16. The non-transitory machine-readable medium of claim 15, wherein remediating the unexpected occupancy further comprises:
  prior to initiating the deployment of the enclosure to the other frame unit of the frame units, confirming, with a user subscribed to use the managed system frame, that the enclosure is authorized to be deployed in the managed system frame.

17. A data processing system, comprising:
  a memory; and
  a processor adapted to perform operations for managing a distributed system comprising managed systems and a subscription manager that manages operation of the managed systems, the operations comprising:
    monitoring, by the subscription manager, frame-unit level occupancy of a managed system frame using sensors associated with frame units of the managed system frame;
    making, by the subscription manager, a comparison between the frame-unit level occupancy of the managed system frame to expected occupancy for the managed system frame;
    making, by the subscription manager, a determination that the comparison indicates an unexpected occupancy in one of the frame units;
    in response to the determination:
      remediating, by the subscription manager, the unexpected occupancy in the one of the frame units;
      updating, by the subscription manager, the frame-unit level occupancy based on the remediated unexpected occupancy in the one of the frame units to obtain updated frame-unit level occupancy for the managed system; and
      deploying, by the subscription manager, at least one of the managed systems to the managed system frame based on the updated frame-unit level occupancy of the managed system.

18. The data processing system of claim 17, wherein the operations further comprise:
  providing, by the subscription manager, subscribed to computer implemented services to a user using the deployed at least one of the managed systems.

19. The data processing system of claim 17, wherein at least one of the sensors comprises a proximity sensor, the proximity sensor being positioned to detect when any of the managed systems are present in a corresponding frame unit of the frame units.

20. The data processing system of claim 19, wherein the proximity sensor is a sensor selected from a group of sensors consisting of a bump sensor, a distance sensor, a capacitance senor, a hall effect sensor, and an infrared radiation sensor.

* * * * *